(12) United States Patent
Unno

(10) Patent No.: US 6,829,041 B2
(45) Date of Patent: *Dec. 7, 2004

(54) PROJECTION OPTICAL SYSTEM AND PROJECTION EXPOSURE APPARATUS HAVING THE SAME

(75) Inventor: Yasuyuki Unno, Tochigi-ken (JP)

(73) Assignee: Canon Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/523,735

(22) Filed: Mar. 13, 2000

(65) Prior Publication Data

US 2003/0128349 A1 Jul. 10, 2003

Related U.S. Application Data

(63) Continuation-in-part of application No. 09/123,443, filed on Jul. 28, 1998.

(30) Foreign Application Priority Data

Jul. 29, 1997 (JP) .......................................... 09-218179
Mar. 12, 1999 (JP) .......................................... 11-066538

(51) Int. Cl.[7] .................. G03B 27/54; G03B 27/42; G02F 1/1335
(52) U.S. Cl. .................. 355/67; 355/53; 349/120
(58) Field of Search .................. 355/67, 33, 61; 372/22, 105; 359/494, 566, 485, 721; 356/351, 366; 349/120

(56) References Cited

U.S. PATENT DOCUMENTS

| | | | |
|---|---|---|---|
| 5,040,896 A | * 8/1991 | Moslehi ...................... 356/351 |
| 5,117,433 A | 5/1992 | Tatsuno et al. ............... 372/22 |
| 5,142,548 A | 8/1992 | Krasinski et al. ........... 372/105 |
| 5,184,176 A | 2/1993 | Unno et al. .................... 355/52 |
| 5,459,000 A | 10/1995 | Unno ............................ 430/5 |
| 5,627,676 A | 5/1997 | Borrelli et al. ............. 359/494 |
| 5,677,755 A | * 10/1997 | Oshida et al. ................ 355/53 |
| 5,694,247 A | * 12/1997 | Ophey et al. ............... 359/566 |
| 5,696,628 A | 12/1997 | Sutton et al. ............... 359/566 |
| 5,805,273 A | 9/1998 | Unno .......................... 355/30 |
| 5,880,891 A | 3/1999 | Furter ........................ 359/651 |
| 5,892,573 A | * 4/1999 | Takahashi et al. ............ 355/61 |
| 5,986,733 A | * 11/1999 | Winker et al. .............. 349/120 |
| 6,055,053 A | * 4/2000 | Lesniak ..................... 356/366 |
| 6,057,970 A | * 5/2000 | Kim et al. .................. 359/721 |

FOREIGN PATENT DOCUMENTS

| EP | WO 98/43135 | 10/1998 |
|---|---|---|
| JP | 8-107060 | 4/1996 |
| JP | 10-270351 | 10/1998 |

OTHER PUBLICATIONS

E. Mochida, "Optical Technique Contact", vol. 27, No. 3 (1989), pp. 127–134.

M. Born, et al., "Principles of Optics", 1st Ed., Pergamon Press, New York, pp. 705–708 (1959).

Aoyama, et al., "Form Birefringence Using Ultra–High Spatial Frequency Gratings", *Optics*, vol. 21, No. 5, pp. 269–274 (1992).

* cited by examiner

Primary Examiner—Peter B. Kim
(74) Attorney, Agent, or Firm—Fitzpatrick, Cella, Harper & Scinto

(57) ABSTRACT

A projection optical system for projecting a pattern of a first object onto a second object, wherein the projection optical system is provided with a birefringence correcting system for correcting birefringence of an optical element of the projection optical system.

26 Claims, 25 Drawing Sheets

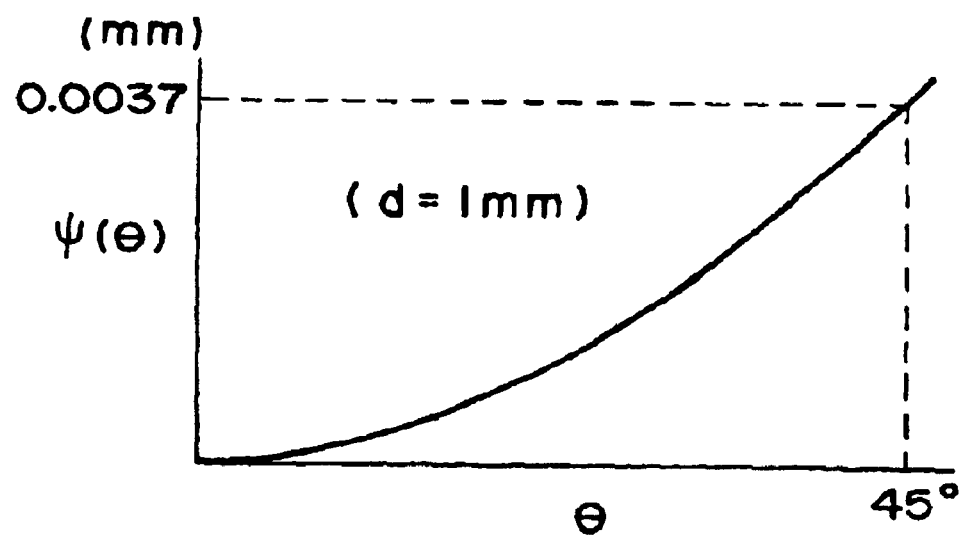
F I G. 32A
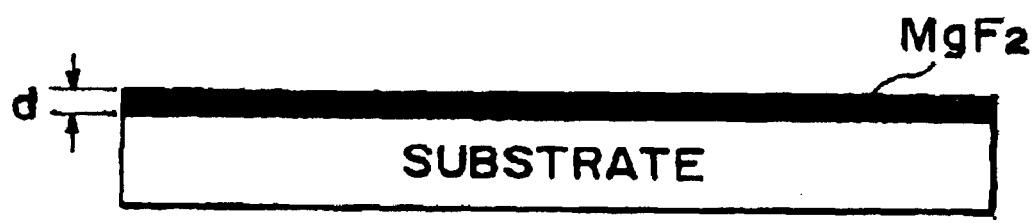
F I G. 32B

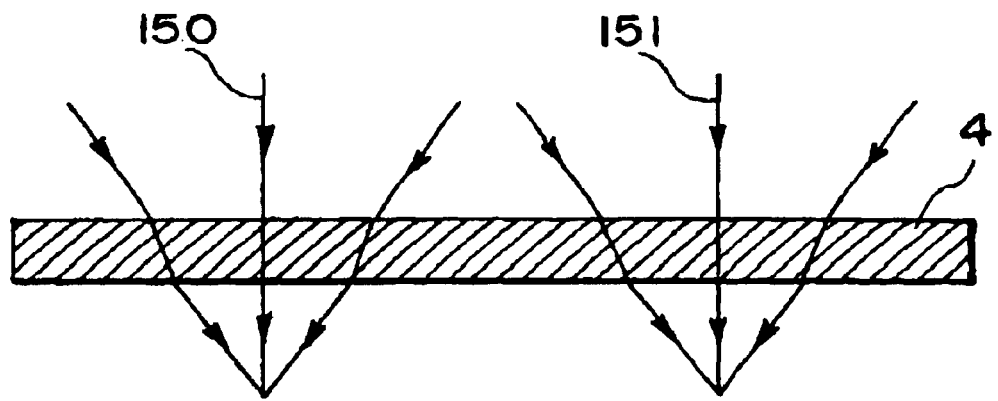
F I G. 35
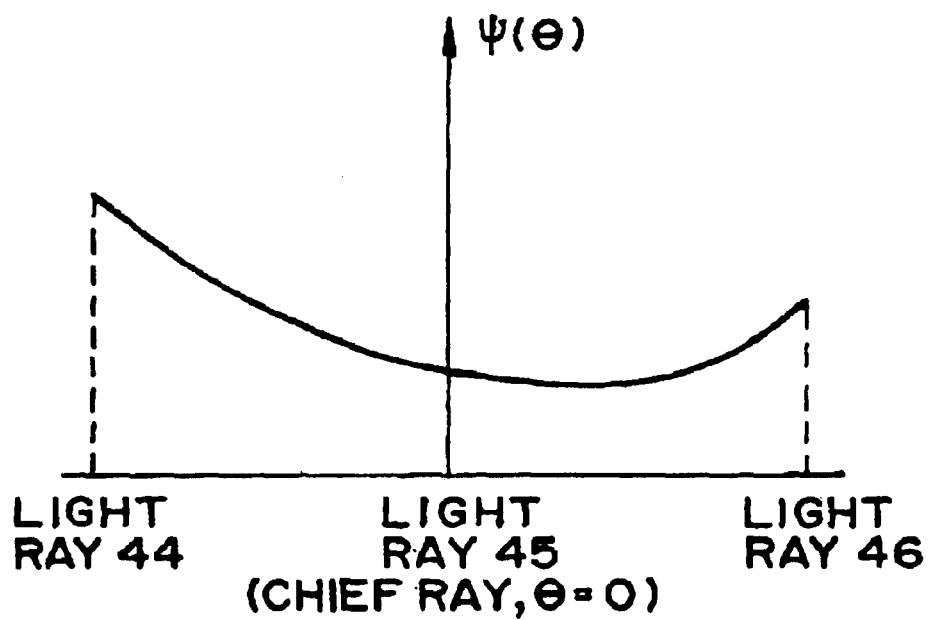
F I G. 36

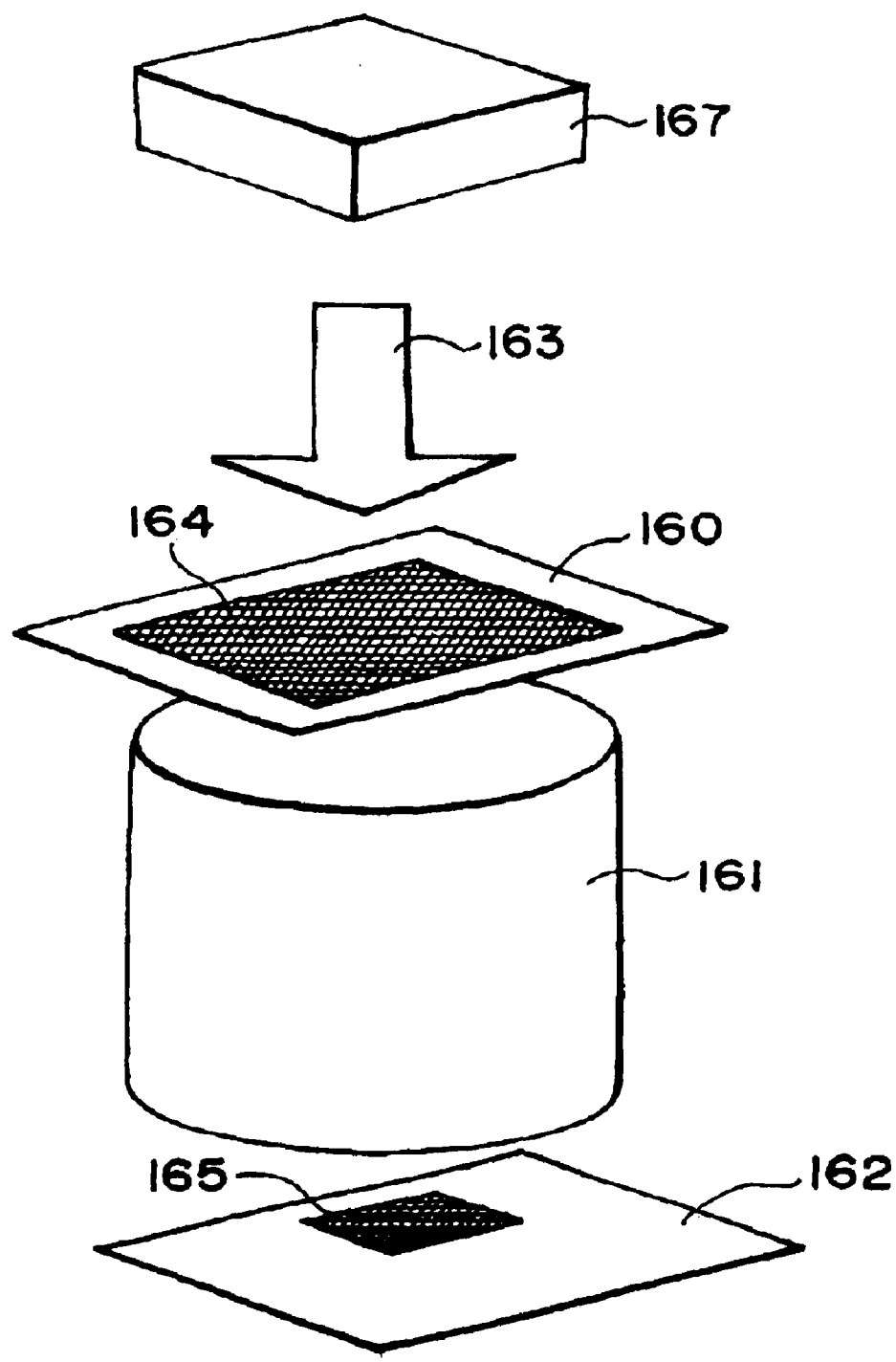
F I G. 40

PROJECTION OPTICAL SYSTEM AND PROJECTION EXPOSURE APPARATUS HAVING THE SAME

This is a continuation-in-part application of U.S. patent application No. 09/123,443 filed Jul. 28, 1998.

FIELD OF THE INVENTION AND RELATED ART

This invention relates to a projection optical system and a projection exposure apparatus having the same, for the manufacture of devices such as semiconductor devices, CCDs, or liquid crystal devices, for example. In another aspect, the invention is concerned with a device manufacturing method using such a projection exposure apparatus. The present invention is particularly suitably usable in a projection exposure apparatus of a step-and-repeat type or step-and-scan type.

The density of semiconductor devices such as a DRAM or CPU, for example, has increased considerably. In the latest devices, a circuit pattern of a size not greater than 0.25 micron is required. Projection exposure apparatuses, called a stepper, are widely used because of their ability of forming such a fine pattern precisely. In such steppers, a pattern of a reticle is illuminated with light of a short wavelength in the ultraviolet region, and it is projected through a projection optical system onto a semiconductor (silicon) wafer in a reduced scale, whereby a fine circuit pattern is formed on the wafer.

For precision transfer of a reticle pattern, many strict conditions are applied to the projection optical system. Since the pattern size being resolvable with the projection optical system is in an inverse proportion to the numerical aperture (NA), the designing should be made to enable enlargement of the numerical aperture. Additionally, the aberration must be corrected precisely over the whole region corresponding to the semiconductor chip.

The designing can be done with the aid of high-speed computers and designing software. Naturally, for production of a projection optical system, it is necessary to make every lens of the projection optical system very precisely, exactly in accordance with the design. But, in addition to this, much attention has to be paid to the glass material or materials to be used. Since the refractive index of a glass material has a large influence to the imaging characteristic of a projection optical system, the uniformity thereof is very strictly controlled, generally to an order of $10^{-6}$ or less. Further, the birefringence or double refraction property of a glass material is largely influential to the imaging characteristic and, therefore, the magnitude thereof should be suppressed to about 2 nm/cm, as is known in the art.

However, with a glass material for a projection optical system which may have a largest diameter of 200 mm, it is very difficult to control the double refraction property so precisely, uniformly over the whole surface. Usually, for reasons to be described below, birefringence would be produced to some degree.

A first reason is attributable to the manufacturing process of a glass material. For light in the ultraviolet region, currently, a quartz (silica) glass is widely used. Thus, the following explanation will be made with reference to quartz glass. As compared with optical crystals, quartz glasses to be used as a lens glass material has no directionality in its structure. Therefore, in an idealistic state, no birefringence is produced.

However, in quartz glasses, birefringence which might be considered as being attributable to remaining stresses such as thermal hysteresis or impurities may be observed experimentally. While the manufacture of quartz glass may be based on a direct method, a VAD (vapor axial deposition) method, a sol-gel method, or a plasma burner method, for example, in any of these methods, it is difficult for current technology to reduce a mixture of impurities to a level that can be disregarded.

Further, in cooling a quartz glass being formed in a high temperature state, it may be possible to reduce the stress, resulting from differences in the way of being cooled between the surface portion and the inside portion of the glass material (i.e., the stress due to thermal hysteresis), to some extent by a thermal treatment such as annealing, for example. But, in principle, it is difficult to completely remove it.

Referring now to FIG. 24, the process of manufacturing a lens element to be used in a lithographic projection optical system will be described. First, an ingot 100 of quartz glass is produced with a revolutionally symmetric shape. It is then sliced with a required thickness, by which a disk-like member 101 is provided. Since the ingot 100 is produced constantly symmetrically with respect to its central axis 100a, distribution of impurities remaining in the member 101 or distribution of stresses therein due to thermal hysteresis appears, as a matter of course, symmetrically with respect to the central axis 101a. At a final stage, cutting and polishing are made to the member 101, whereby a lens element 102 is provided.

Now, distortion which may appear when impurities are mixed into the ingot 100 will be explained. FIG. 25 is a sectional view of the ingot 100. The peripheral hatching at 103 in this example shows a portion with a high impurity density. During an annealing process, the ingot 100 is heated. In the state with heat applied, the inside stress reduces to substantially zero. Through gradual cooling from that state, idealistically, a material without inside stress at room temperature can be provided. However, if impurities are mixed, the thermal expansion coefficient of the material changes. If the thermal expansion coefficient increases with the mixture of impurities, as a matter of course, it causes an increase of contraction during the cooling process.

As a result, although there is no stress in the heated state, the peripheral portion contracts largely with a temperature decrease. If particular attention is paid to the central portion of the glass material where a light flux is going to pass, it receives contraction from the peripheral portion as depicted by arrows in FIG. 25. That is, inside stresses are produced. The inside stress is a cause for birefringence.

A second reason is attributable to a change, with time, of quartz glass when used in a stepper. As is known in the art, if light from a short-wavelength light source such as a KrF or ArF laser is projected to a quartz glass, a phenomenon called "compaction" may occur. Although details of how it occurs are not described here, what can be observed in that phenomenon is that the refractive index of the portion through which the light has passed increases but the volume of that portion decreases.

In FIG. 26, if laser light is projected to a hatched region 111 of the disk-like member 110, the volume of that portion is likely to decrease. Since the peripheral portion not irradiated with laser light is not influenced by compaction, as the whole, the central portion is likely to contract whereas the peripheral portion is likely to act against the contraction.

In a balanced state, therefore, when particular attention is paid to the central portion of the glass material where light passes, it receives tension forces from the peripheral portion as depicted by arrows in FIG. 27. Thus, inside stresses are produced. The inside stress is a cause for birefringence. The phenomenon described above may occur similarly in a projection optical system of a stepper. Since the phenomenon of compaction is particularly notable with use of ArF laser light, it may cause a large problem when a projection exposure apparatus with a light source of an ArF laser is practically developed.

As described, practically, it is very difficult to completely remove birefringence to be produced in a glass material. To the contrary, the requirement for birefringence in a stepper projection optical system is becoming strict, more and more. For providing a higher performance projection optical system, the number of lens elements constituting the projection optical system is increasing and, thus, the total glass material thickness is increasing. Therefore, even if the birefringence per unit length is kept to the above-described quantity (about 2 nm/cm), the total birefringence quantity of the system becomes large. Further, recent shortening in the wavelength of an exposure light source functions to enlarge the influence of birefringence.

Specifically, a comparison will be made to a case with the use of i-line light (wavelength 365 nm) and a case with the use of an ArF laser light source (wavelength 193 nm). If, for example the whole optical system has a birefringence property of 100 nm, in the case of i-line of 365 nm wavelength, it corresponds to a wavefront aberration of $100/365=0.27$ wavelength. For an ArF laser light source of 193 nm wavelength, it corresponds to a wavefront aberration of $100/193=0.52$ wavelength. Thus, for the same birefringence, the influence to an imaging characteristic is larger with a shorter wavelength.

As regards an optical glass material having birefringence in central symmetry, Japanese Laid-Open Patent Application, Laid-Open No. 107060/1996 shows the use of lens elements made of different glass materials having different birefringence quantities, and suggests reduction of adverse influence to the imaging characteristic by optimizing a combination of the glass materials. However, increasing a requirement to further improve the precision of a projection optical system cannot be met even by such a method. It is, therefore, desirable to cancel the birefringence itself of a glass material.

SUMMARY OF THE INVENTION

It is an object of the present invention to provide an improved projection optical system and/or an improved projection exposure apparatus having the same, for the manufacture of devices such as semiconductor devices, CCDs, or liquid crystal devices, for example, by which at least one of the problems described above can be solved.

It is another object of the present invention to provide a device manufacturing method using such a projection exposure apparatus.

In accordance with an aspect of the present invention, there is provided a projection optical system for projecting a pattern of a first object onto a second object, wherein said projection optical system is provided with birefringence correcting means for correcting birefringence of an optical element of said projection optical system.

Said birefringence correcting means may comprise at least one optical member having a predetermined form birefringence.

Said at least one optical member may be arranged so that a distribution, including a distribution of form birefringence produced by said at least one optical member, is effective to cancel the birefringence to be produced by an optical element of said projection optical system.

Said at least one optical member may be arranged to produce form birefringence on the basis of a diffraction grating having a period smaller than a wavelength used.

Said diffraction grating may be provided on the surface of the optical element of said projection optical system.

Said birefringence correcting means may comprise at least one optical member having a predetermined stress distribution.

Said at least one optical member may be arranged so that a distribution, including a distribution of stresses produced by said at least one optical member, is effective to cancel the birefringence to be produced by an optical element of said projection optical system.

In accordance with another aspect of the present invention, there is provided a projection exposure apparatus, comprising: an illumination system for illuminating a first object with light; and a projection optical system as recited above, for projecting a pattern of the first object illuminated with the light from said illumination system, onto a second object for exposure of the same.

In accordance with a further aspect of the present invention, there is provided a projection exposure apparatus, comprising: illuminating means for illuminating a first object with slit-like light; scanning means; and a projection optical system as recited above, for projecting a pattern of the first object onto a second object while the first and second objects are simultaneously scanned in a widthwise direction of the slit-like light, at a speed ratio corresponding to a projection magnification of said projection optical system.

In accordance with a yet further aspect of the present invention, there is provided a device manufacturing method including a process for printing a device pattern on a substrate by use of a projection exposure apparatus as recited above.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 32A is a graph for explaining a specific example of a birefringence correction amount.

FIG. 32B is a schematic view of a structure wherein a birefringence correcting member is integrally provided on a transparent substrate.

FIG. 35 is a schematic view for explaining a distribution of light rays, with respect to an off-axis object point.

FIG. 36 is a graph for explaining the influence of birefringence, with respect to an off-axis object point.

FIG. 40 is a schematic view of a main portion of a stepper (step-and-repeat exposure apparatus) with a projection optical system, according to a sixth embodiment of the present invention.

DESCRIPTION OF THE PREFERRED EMBODIMENTS

Figure 1:
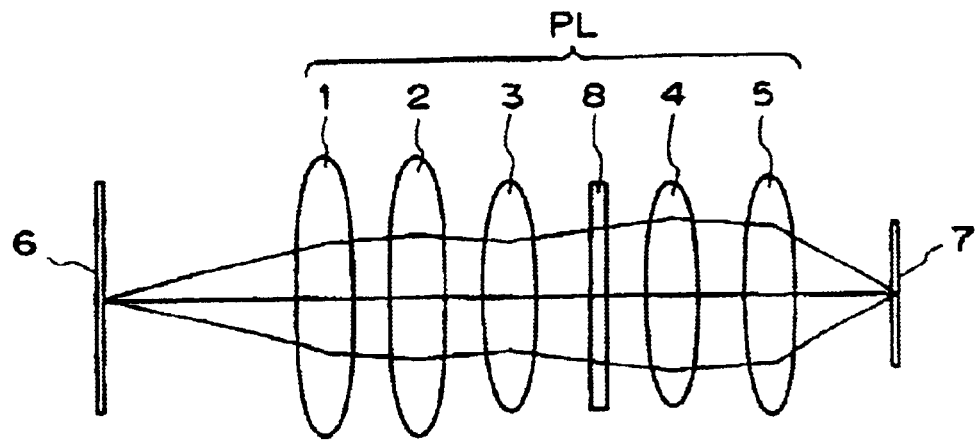
FIG. 1 is a schematic and sectional view of a projection optical system according to a first embodiment of the present invention.

FIG. 1 is a schematic view of a main portion of a projection optical system according to an embodiment of the present invention. This embodiment is applicable to a step-and-repeat type or step-and-scan type projection exposure apparatus. Denoted in the drawing at PL is a projection optical system which is usually provided by several tens of optical elements having their aberrations corrected precisely. For simplicity of illustration, only lens elements 1–5 are illustrated.

The lens elements 1–5 are provided by cutting and polishing quartz (silica) glass, although the glass material is not limited to quartz. Details of the structure of the projection optical system PL as the same is incorporated into a stepper, will be described later. Denoted at 6 is a reticle, and denoted at 7 is a wafer. The projection optical system PL projects a pattern on the reticle 6 surface onto the surface of the wafer 7, in a reduced scale and through a step-and-repeat or step-and-scan procedure.

Denoted in the drawing at 8 is a birefringence correcting member according to the present invention. Details of the function of it will be described later.

Figure 2:
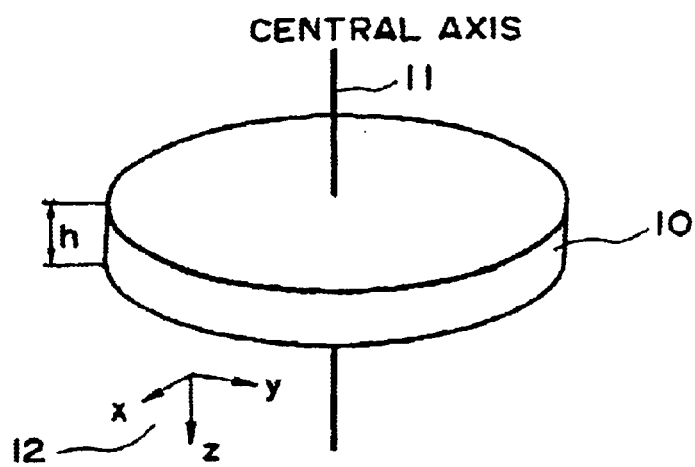
FIG. 2 is a schematic view for explaining the influence of residual distortion of an optical element.

For quartz glass which is the material of the lens elements 1–5, as described hereinbefore, it is difficult to completely avoid production of distortion, symmetrical with respect to a central axis, during the manufacturing procedure. Also, when it is used with a short wavelength light source such as an ArF laser, there occurs distortion due to the influence of volume contraction caused by compaction. The influence of such distortion in a glass material will now be explained. Referring to FIG. 2, the stress to be produced by distortion will be described first.

Figure 3:
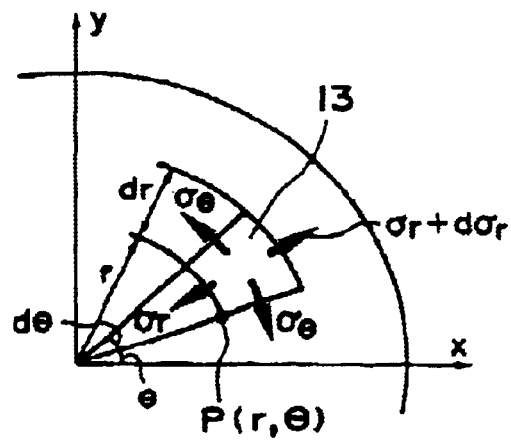
FIG. 3 is a chart for explaining the influence of residual distortion of an optical element.

In FIG. 2, denoted at 10 is a circular or disk-like plate having been separated, by cutting with a predetermined thickness h, from a quartz glass ingot. The illustrated plate is a glass material at a pre-stage before it is formed into a lens element. Denoted at 11 is the central axis of the disk plate 10. Coordinates of x, y and z axes are defined as denoted at 12. In this example, the stress along the central axis 11 (in the z direction) can be disregarded. Therefore, particular attention may be paid only to stress $\sigma_r$ in the radial direction and stress $\sigma_\theta$ in the circumferential direction at a point P (FIG. 3) which is represented by coordinates (r, θ) along x-y plane. If a balance of force in the radial direction at a small region 13 (with hatching) adjacent to point P is considered, a relation:

$$-\sigma_r \cdot rd\theta + (\sigma_r + d\sigma_r)(r+dr)d\theta - \sigma_\theta d\theta \cdot dr = 0$$

is obtained. When simplified with high-order small values omitted, the resultant is:

$$\sigma_\theta - \sigma_r = r(d\sigma_r/dr) \qquad (1)$$

Since distortion remaining in the glass material 10 changes with the radial direction, generally differentiation of stress $\sigma_r$ with a radius r does not become equal to zero. Therefore, for r≠0 (other than on the central axis), the right hand side of equation (1) has a finite value other than zero. It means that, except for on the central axis 11, the stress $\sigma_r$ in the radial direction and the stress $\sigma_\theta$ in the circumferential direction have different values.

Figure 4:
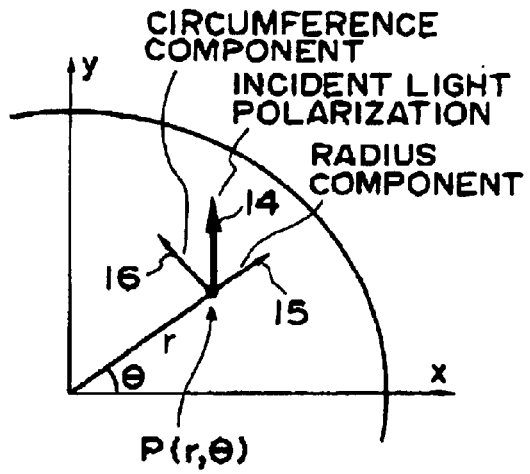
FIG. 4 is a chart for explaining the influence of birefringence of an optical element.
Figure 5:
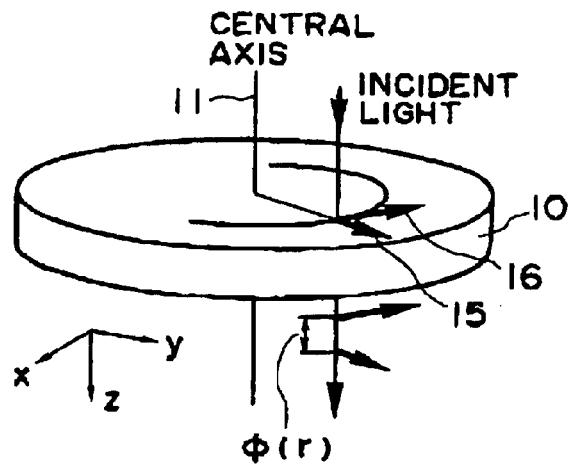
FIG. 5 is a schematic view for explaining the influence of birefringence of an optical element.

The influence which can be optically observed in such a case will be explained with reference to FIGS. 4 and 5. It is assumed as shown in FIG. 4 that light of a wavelength λ and being rectilinearly polarized is incident on a point P (r, θ) position. Here, the direction of polarization of the rectilinearly polarized light is illustrated with an arrow 14. When this light passes through the disk plate 10, it is influenced by different refractive indexes, being different for a polarization component 15 in the radiation direction and a polarization component 16 in the circumferential direction. As a result of it, after passing the disk plate 10, there occurs a phase difference Φ between these two polarization components, as illustrated in FIG. 5. As regards the state of polarization of light, the rectilinear polarization is converted into elliptical polarization. Here, by using stresses $\sigma_r$ and $\sigma_\theta$, the phase difference Φ can be expressed as follows:

$$\Phi(r) = (2\pi/\lambda) C \cdot h \{\sigma_\theta(r) - \sigma_r(r)\} \qquad (2)$$

where C is called an "optical elastic constant" which is a value inherent to the material. As the light passes through the disk-like glass material 10 in this manner, the state of polarization thereof changes. Although the influence in each glass lens element is very small, as the light passes through several tens of elements, an adverse influence which cannot be disregarded is applied to the imaging characteristic of the projection optical system. In a practical projection optical system, the influence of equation (2) may be considered with respect to each element and, for the whole projection optical system, the quantity of phase change due to birefringence may be added. Then, the result may be such as shown in FIG. 6.

Here, the axis of abscissa is represented by pupil coordinates ρ of the optical system, in place of the radius r of the optical element. The pupil coordinates will be explained with reference to FIG. 7. Denoted in the drawing at 17 and 18 are lens elements. When a particular attention is paid to a light ray 19 which passes the lens elements 17 and 18, in order to designate its position, it is necessary to use plural parameters such as a radius $r_1$ measured from the central axis (optical axis) 20 for the lens element 17 and a radius $r_2$ measured from the central axis 20 for the lens element 18. This is inconvenient.

In consideration of it, particular attention may be paid to the pupil position 21 of the whole optical system, and the light ray 19 may be designated with the height pupil coordinates ρ where the light ray 19 passes. On that occasion, the characteristic of the optical system can be represented by a single parameter. Thus, by using ρ as the pupil coordinates, the position of light passing through the optical system can be designated. The maximum value is $\rho_0$.

Figure 6:
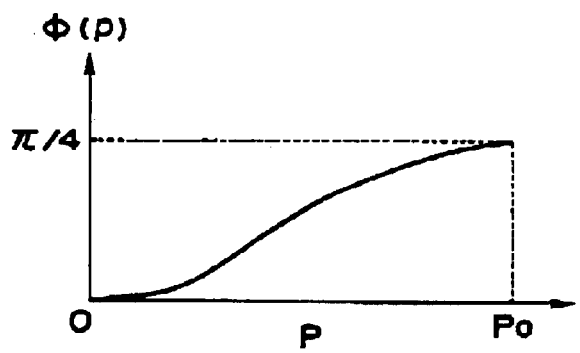
FIG. 6 is a graph for explaining a phase difference produced by birefringence of a glass material according to the present invention.

The result shown in FIG. 6 is one that can be measured experimentally by using an actually assembled optical system and by using measures such as a phase modulation method, for example. However, if the precision may be sacrificed to some extent, it can be calculated by simulation. The phase modulation method is discussed in detail by E. Mochida in "Optical Technique Contact", Vol.27, No.3 (1989), for example, and a description thereof will be omitted here. The phase modulation method shows high sensitivity and it enables measurement at a precision $10^{-8}$ with a value of refractive index difference Δn due to birefringence. Also, it has an advantage that the fast axis and slow axis can be determined simultaneously.

Once the fast axis and slow axis are determined, the sign of Φ(r) in FIG. 6 can be determined directly. Anyway, what is suggested in FIG. 6 is that, for the light which passes the center (ρ=0) of the optical system, the quantity of phase shift due to birefringence is zero, whereas, for the light which passes the peripheral portion (ρ=$\rho_0$), the quantity of phase shift due to birefringence becomes up to π/4.

While a detailed explanation of the influence to the imaging characteristic using theoretical equations will be omitted here, what can be observed is the phenomenon that astigmatism of a magnitude of about λ/4 appears in the optical system. The aberration which can be admitted for a projection optical system of a stepper is a λ/100 order, and a large aberration such as above would not be admitted.

In the present invention, in consideration of the above, a birefringence correcting member 8 (FIG. 1) is used in the optical system, so as to cancel the phase change such as shown in FIG. 6. In order to cancel birefringence which is produced symmetrically with respect to the optical axis, as will be readily understood, a member having birefringence of opposite signs symmetrical with respect to the optical axis may be used. However, the magnitude of birefringence should be substantially the same as the magnitude of birefringence to be produced by the whole protection optical system PL.

Here, a detailed structure of the birefringence correcting member 8 will be explained. As regards the material of the birefringence correcting member, in consideration of the need that it is transparent to exposure light and it has sufficient durability, it should be of the same material as the optical glass used for the lens elements 1–5. In order that birefringence with a predetermined distribution is produced by such optical glass, in this embodiment, the phenomenon called "form birefringence" is used.

Now, referring to FIG. 8, the form birefringence will be explained. Denoted in the drawing at 25 is a phase type diffraction grating which is formed on the surface of an optical glass. As best shown with the enlarged illustration at a right hand portion of FIG. 8, the diffraction grating 25 has a period b and a depth d. The width of the optical glass portion that defines a fine grating is a. Here, for subsequent discussion, a duty ratio t is defined as t=a/b. Denoted at 26 is input light (wavelength=λ), being incident on the diffraction grating 25 Denoted at 27 is output light which exits from the diffraction grating.

Denoted at 28 is a polarization component, of the input light 26, in a direction parallel to the grooves of the diffraction grating 25, and denoted at 29 is a polarization component thereof in a direction perpendicular to the grooves of the diffraction grating 25. Similarly, denoted at 30 is a polarization component, of output light 27, in a direction parallel to the grooves of the diffraction grating 25, and denoted at 31 is a polarization component thereof in a direction perpendicular to the grooves of the diffraction grating 25.

Here, as regards the period b of the diffraction grating, a condition "b not greater than λ" should be satisfied to prevent production of diffractive light other than zero-th order diffractive light, as the output light 27.

Figure 8:
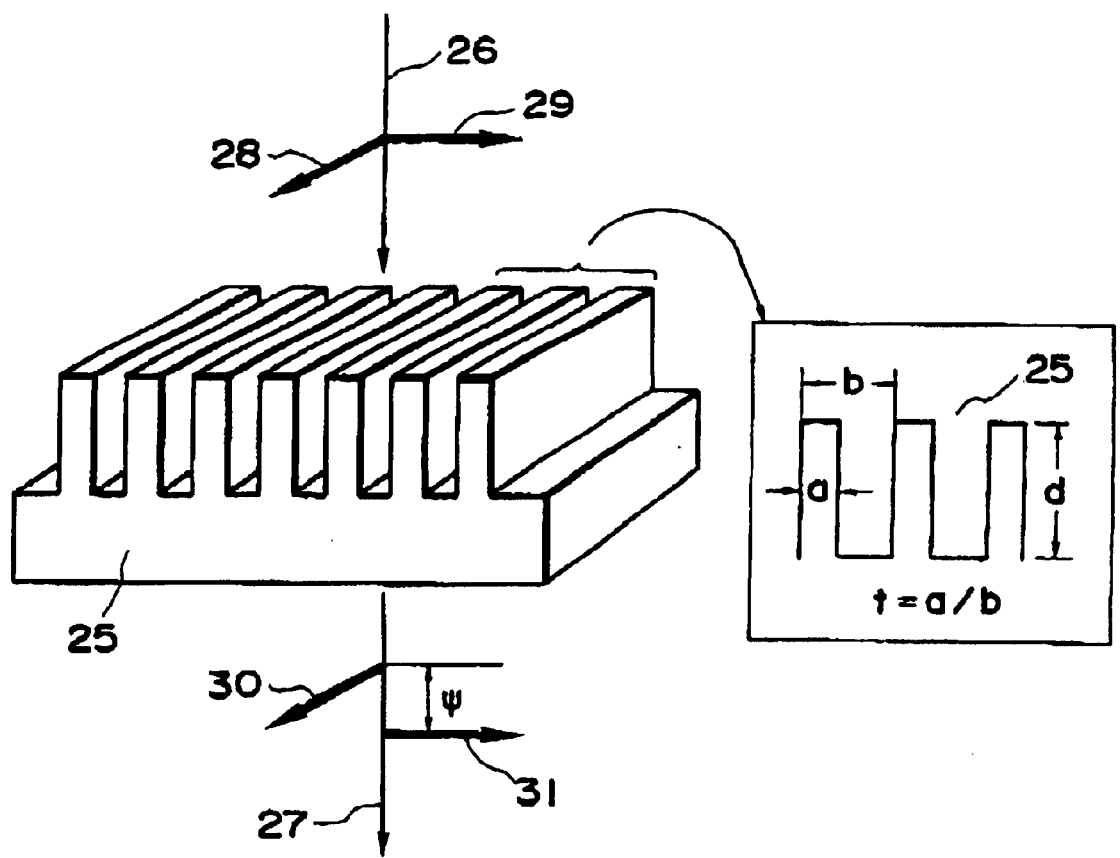
FIG. 8 is a schematic view for explaining form birefringence of birefringence correcting means according to an embodiment of the present invention.

In FIG. 8, while in the input light 26 there is no phase difference between the polarization components 28 and 29, with the passage through the diffraction grating 25, there occurs a phase difference Ψ between the polarization components 30 and 31. Thus, it is seen that, if the input light 26 is rectilinearly polarized light, the output light 27 is converted into elliptically polarized light. Such a phenomenon is called "form birefringence", as is well known in the field of optics.

Details of form birefringence are described by M. Born and E. Wolf in "Principles of Optics", 1st. ed., Pergam on Press, New York, 1959, pp705–708, or by Aoyama, et al., in "Optics", Vol.21, No.5, pp369–274, 1992, for example.

Figure 9:
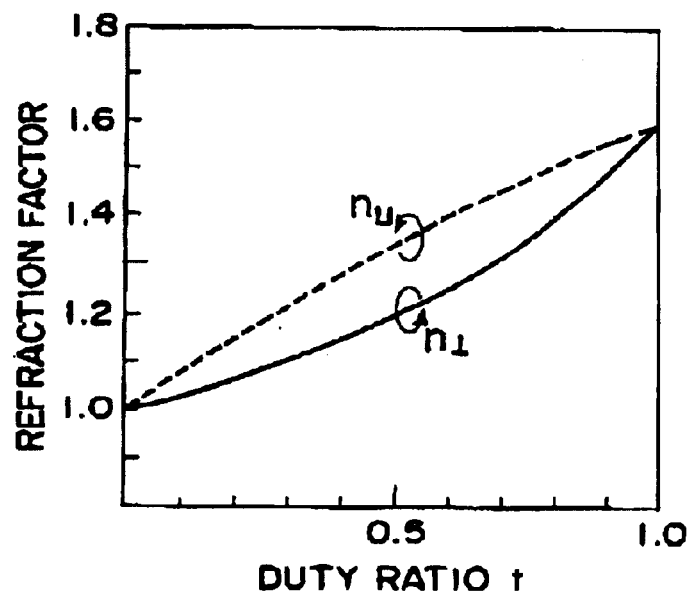
FIG. 9 is a graph for explaining a difference in refractive index due to directionality of polarized light.

A fine diffraction grating such as at 25 in FIG. 8 shows different refractive indexes, being different with the direction of polarization of the input light 26. The refractive index $n_{//}$ where the polarization of input light 26 is parallel to the grooves of the diffraction grating 25 as well as the refractive index $n_{195}$ where the polarization of input light 26 is perpendicular to the grooves of the diffraction grating 25, are expressed as follows:

$$n_{//} = \sqrt{tn_1^2 + (1-t)n_2^2} \quad (3)$$

$$n_\perp = 1/\sqrt{(t/n_1^2) + [(1-t)/n_2^2]} \quad (4)$$

where t is the duty ratio having been defined above, $n_1$ is the refractive index of the member which constitutes the diffraction grating 25, and $n_2$ is the refractive index of the medium at the side where the light is incident. FIG. 9 shows the result of a calculation of the dependency of $n_{//}$ and $n_\perp$ upon t, with the calculation being made under the condition that $n_1$=1.6 and $n_2$=1.0. Further, when the groove depth of the diffraction grating 25 is d, the phase difference Ψ which appears between the polarization component parallel to the diffraction grating grooves and the polarization component perpendicular to the diffraction grating grooves is given by:

$$\Psi = (2\pi d/\lambda)(n_{//} - n_\perp) \quad (5)$$

From equations (3)–(5), it is seen that the value of the phase difference can be set as desired by appropriately selecting the duty ratio t and groove depth d.

Figure 7:
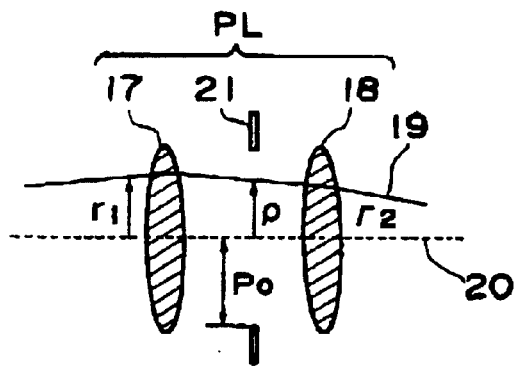
FIG. 7 is a schematic view for explaining pupil coordinates of an optical system.

The birefringence correcting member 8 may be inserted to the pupil position 21 of the projection optical system PL in FIG. 7. The detailed structure thereof will now be explained, with reference to FIG. 10.

Figure 10:
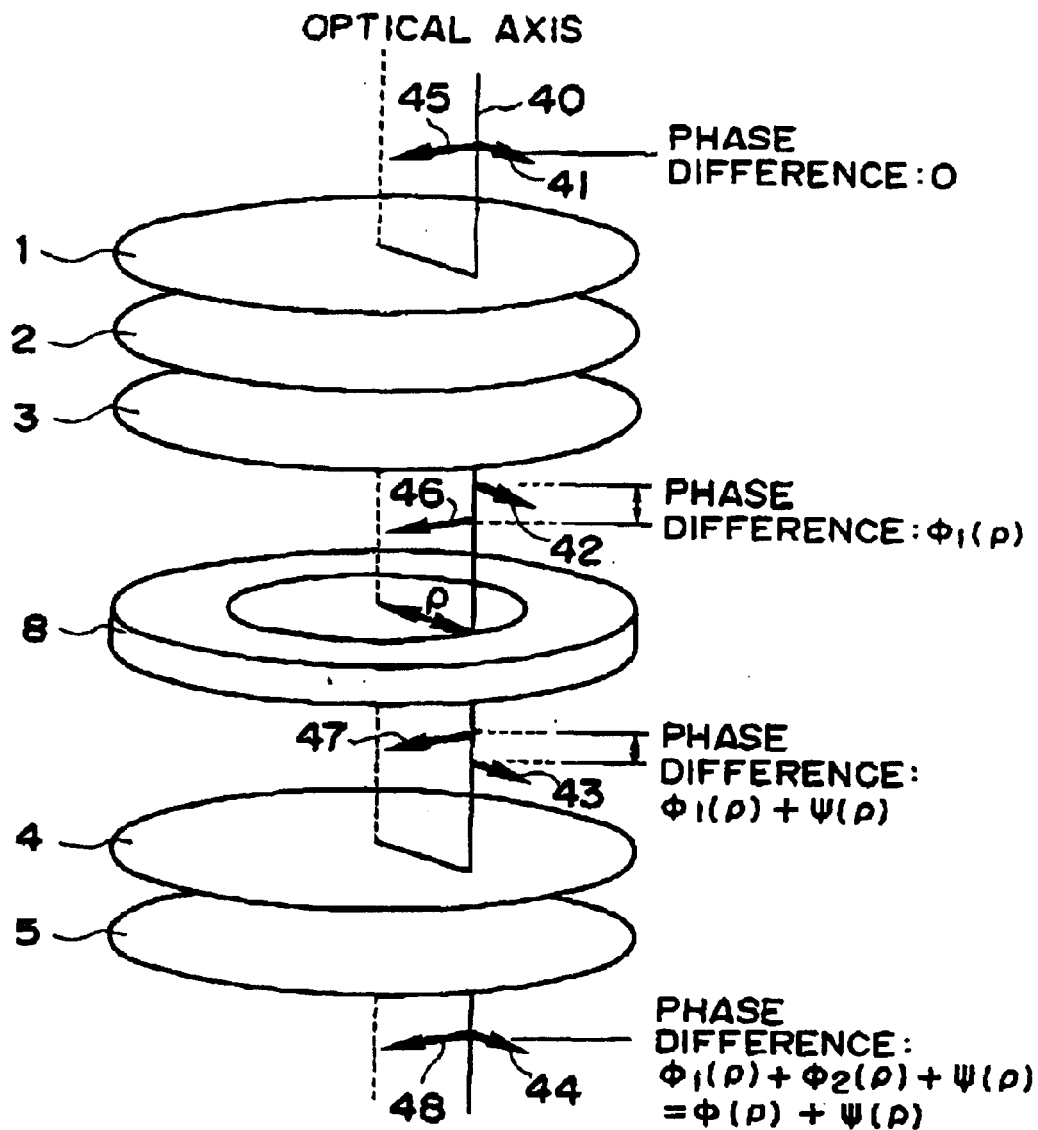
FIG. 10 is a schematic view for explaining a phase change due to birefringence, in the present invention.

FIG. 10 is a schematic view for explaining the relation of phase difference between a polarization component in the radial direction and a polarization component in the circumferential direction, as the light being designated by a pupil radius ρ in the projection optical system of FIG. 1 goes through the lens elements 1–5 and the birefringence correcting member 8. If, in the glass material, the birefringence which is symmetric with respect to the optical axis is assumed, there occurs a phase difference between the radial polarization component of input light and the circumferential polarization component, as has been described with reference to FIGS. 4 and 5.

In FIG. 10, denoted at 41–44 are polarization components in the radial direction. Denoted at 45–48 are polarization components in the circumferential direction. The phase difference between them is, of course, zero until the light 40 enters the lens element 1.

Here, it is assumed in this example that there is a phase difference Φ(ρ) shown in FIG. 6 being caused as a function of the pupil radius coordinates ρ and by the birefringence produced in the lens elements 1–5. Also, it is assumed that the phase difference Φ(ρ) is solved in accordance with a relation Φ(ρ)=Φ$_1$(ρ)+Φ$_2$(ρ), and that the phase difference Φ$_1$(ρ) is taken as the phase difference produced by the lens elements 1–3 while the phase difference Φ$_2$(ρ) is taken as the phase difference produced by the lens elements 4–5.

Further, it is assumed that in the birefringence correcting member 8 a phase difference Ψ(ρ) is produced between the polarization components in the radial direction and circumferential direction as a function of the pupil coordinates ρ. Then, as regards the light just before it is incident on the birefringence correcting member 8, the phase difference between the radial direction polarization component and the circumferential direction polarization component is given by Φ$_1$(ρ), whereas the phase difference just after the light passes the birefringence correcting member 8 is given by Φ$_1$(ρ)+Ψ(ρ). Further, the phase difference after passage through the lens elements 4–5 is given by:

$$\Phi_1(\rho) + \Phi_2(\rho) + \Psi(\rho) = \Phi(\rho) + \Psi(\rho) \quad (6)$$

In accordance with this embodiment of the present invention, a birefringence member which can apply a phase difference function Ψ(ρ) with which equation (6) results in zero is inserted into the optical path.

Figure 11:
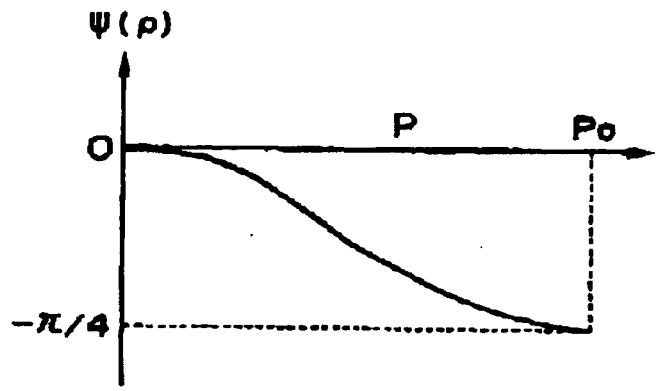
FIG. 11 is a graph for explaining the quantity of phase change to be produced by a birefringence correcting member.

Considering this in combination with FIG. 6, it is readily understood that the phase difference function Ψ(ρ) with which equation (6) results in zero is the one shown in FIG. 11. Namely, it has an opposite sign to the phase difference Φ(ρ) but has the same absolute value.

As has been described, by using a fine diffraction grating 25 having form birefringence and by appropriately selecting its duty ratio t and groove depth d, the phase difference between the polarization component parallel to the diffraction grating groove and the polarization component perpendicular thereto can be set as desired.

Figure 12:
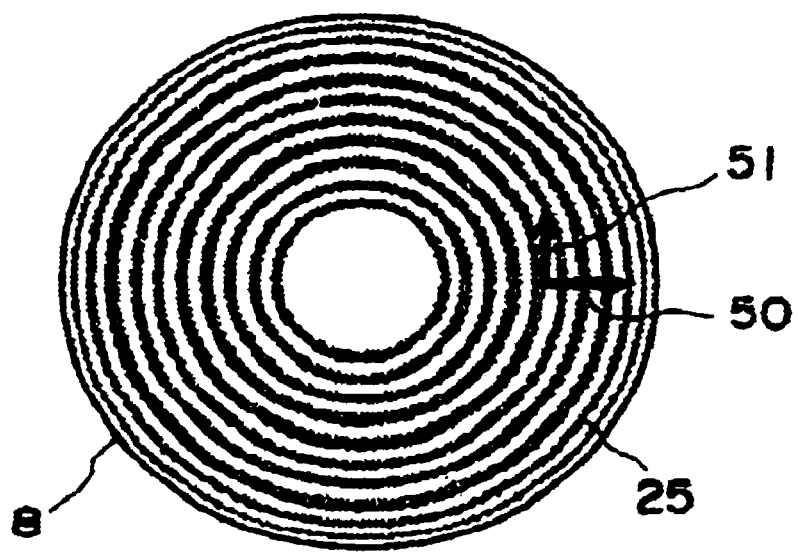
FIG. 12 is a schematic view of a birefringence correcting member which is based on form birefringence according to the present invention.
Figure 13:
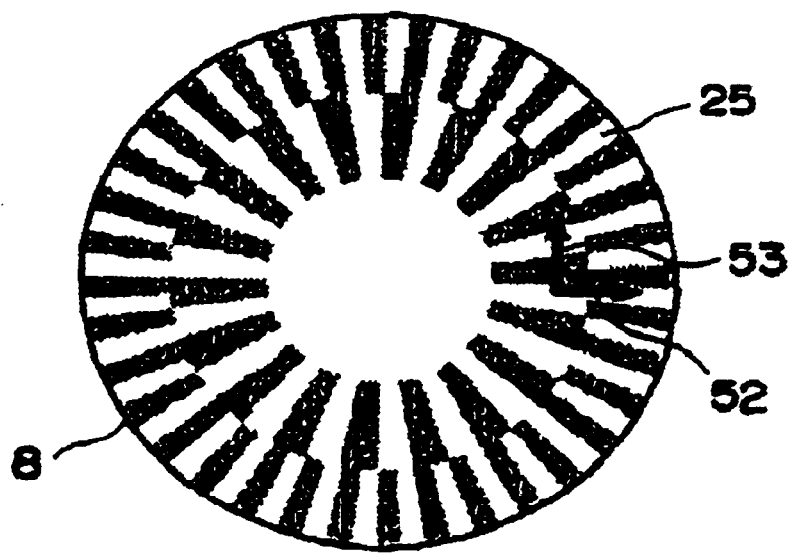
FIG. 13 is a schematic view of another birefringence correcting member which is based on form birefringence according to the present invention.

Thus, in the birefringence correcting member 8, a fine diffraction grating is formed on its surface so that it is symmetric with respect to the optical axis. On that occasion, as shown in FIG. 12, the diffraction grating 25 may be disposed concentrically with respect to the optical axis. Alternatively, the diffraction grating 25 may be disposed radially with respect to the optical axis, as shown in FIG. 13.

For the period of the fine diffraction grating necessary for producing form birefringence, only the condition not greater than the wavelength is required, as has been described hereinbefore. However, if the period is too small, the manufacture becomes difficult. Thus, in a case where the diffraction grating is disposed radially with respect to the optical axis, the radial direction may be divided into plural regions such as shown in FIG. 13, and in each region the period satisfies the above condition.

The structures shown in FIGS. 12 and 13 have a difference in function, such as follows. As regards the light incident on point P in FIG. 12, and between polarization component 50 in the radial direction and polarization component 51 in the circumferential direction, with the passage of light through the member 8, the phase of the polarization component 51 in the circumferential direction can be relatively delayed relative to the phase of the polarization component 50 in the radial direction. On the other hand, with respect to the structure of FIG. 13, the phase of a polarization component 53 in the circumferential direction can be relatively advanced relative to the phase of a polarization component in the radial direction. Namely, they can be used selectively in accordance with the sign of birefringence produced by the projection optical system. Here, in order to produce the phase difference $\Psi(\rho)$ shown in FIG. 1, the structure of FIG. 13 may be used.

Figure 14:
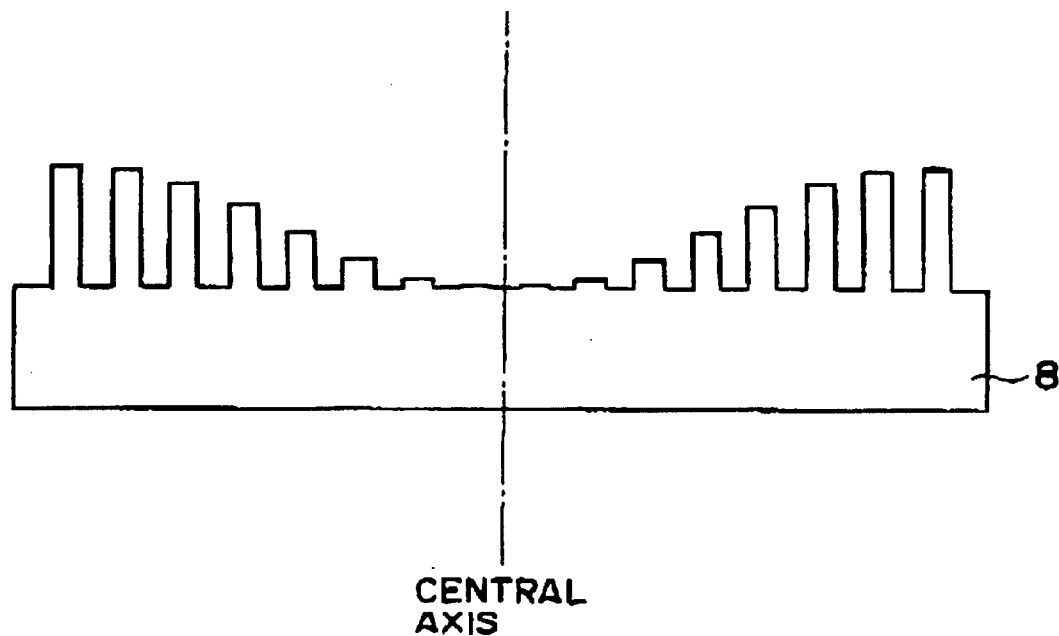
FIG. 14 is a schematic view for explaining a grating depth distribution of a fine diffraction grating according to the present invention.

As a matter of course, the amount of phase correction should be changed with the radial direction. To this end, the duty ratio of the fine diffraction grating or its groove depth may be changed with the radial direction. However, it is very difficult in manufacture to change the duty ratio continuously. An example of changing the depth may be such as shown in FIG. 14. The amount of phase correction is zero on the optical axis of an optical system, as seen also from FIG. 11. Thus, in FIG. 14, the fine diffraction grating may have a groove depth which is zero in the neighborhood of the central axis and which increases toward the periphery.

As regards the position where the birefringence correcting member 8 is to be inserted, although it is preferably near the pupil position of the projection optical system, it is not limited to there. Further, although in this embodiment, the birefringence correcting member comprises a parallel flat plate, the shape is not limited to parallel flat plate. It may have a shape with a convex surface or concave surface, like an ordinary lens element.

Figure 15A:
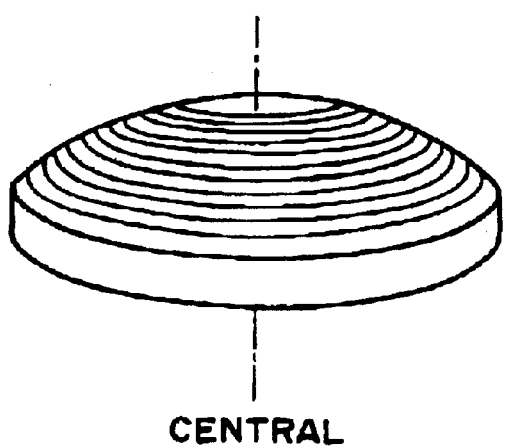
FIGS. 15A and 15B are schematic views, respectively, of examples of fine diffraction gratings according to the present invention, each being provided on a convex surface.
Figure 15B:
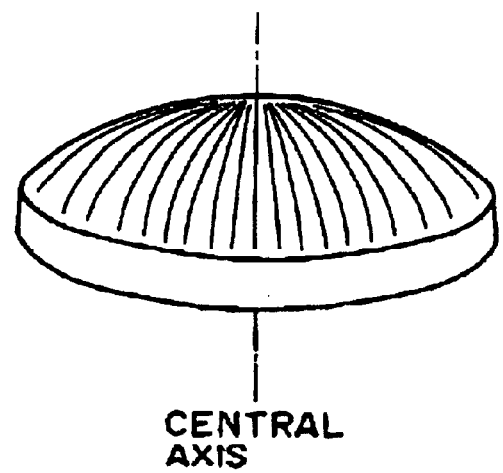

FIG. 15A shows an example wherein a fine diffraction grating is formed on a convex surface, concentrically with respect to the central axis. FIG. 15B shows an example wherein a fine diffraction grating is formed on a convex surface, radially with respect to the central axis.

While the present embodiment has been described with reference to examples wherein the birefringence correcting member is provided by a single optical element, it may comprise plural optical members with the birefringence correction amount shared by them. On that occasion, it becomes possible to correct larger birefringence produced in a projection optical system or birefringence having a complex distribution.

Figure 16:
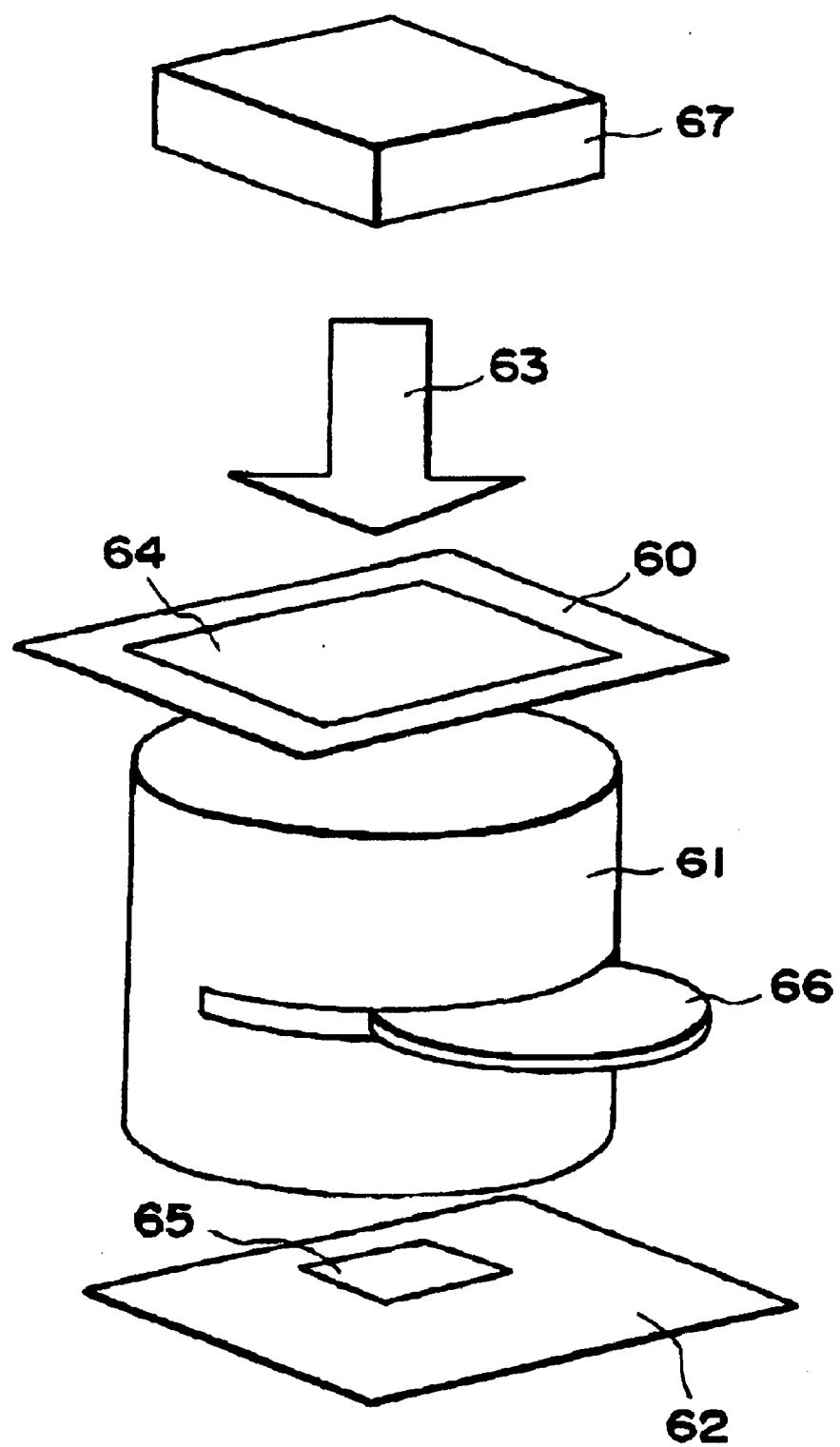
FIG. 16 is a schematic view of a main portion of a stepper according to another embodiment of the present invention.

FIG. 16 is a schematic view of a main portion of a step-and-repeat type exposure apparatus, according to a second embodiment of the present invention, with a projection optical system of the present invention incorporated therein. Denoted in the drawing at 60 is a reticle having a circuit pattern formed thereon. Denoted at 61 is a projection optical system according to the present invention, and denoted at 62 is a wafer onto which the circuit pattern is to be transferred. Illumination light 63 from an illumination system 67 illuminates an illumination region 64 on the reticle 60 surface, and the circuit pattern formed in that region 64 is transferred by the projection optical system 61 onto an exposure region 65 on the wafer 62 in a reduced scale. In a stepper, the pattern of the reticle 60 is transferred at once to the wafer 62 in a reduced scale. After this, the wafer 62 is moved stepwise by a predetermined amount, and then the exposure is performed again. This procedure is repeated.

Denoted in the drawing at 66 is a birefringence correcting member. In this embodiment, the birefringence correcting member 66 itself can be demounted or replaced by another, so that the amount of correction thereby can be changed in accordance with the amount of birefringence of the projection optical system 61.

Figure 17:
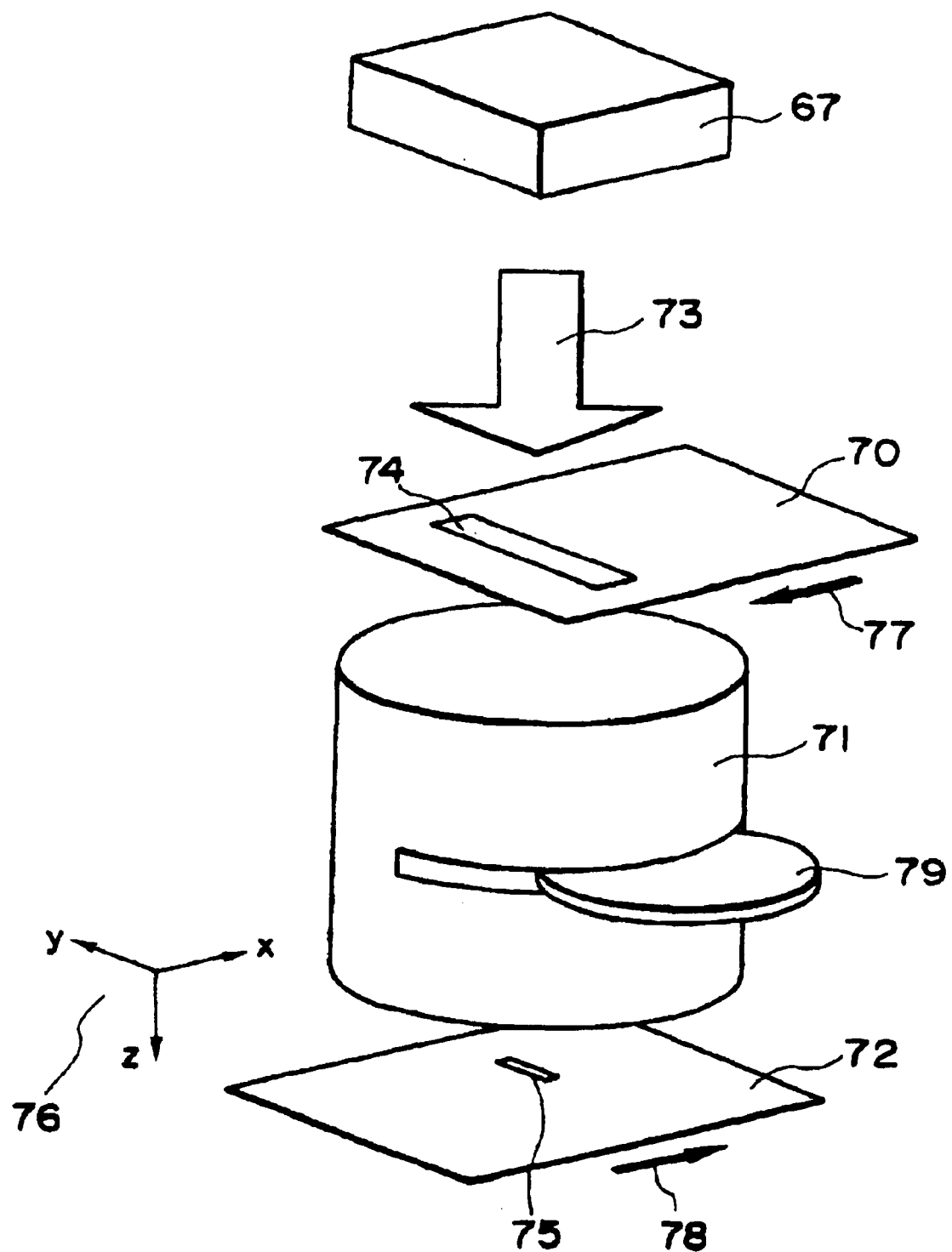
FIG. 17 is a schematic view of a main portion of a step-and-scan type projection exposure apparatus according to a further embodiment of the present invention.

FIG. 17 is a schematic view of a main portion of a step-and-scan exposure apparatus according to a third embodiment of the present invention, with a projection optical system of the present invention incorporated therein. Denoted in the drawing at 70 is a reticle having a circuit pattern formed thereon. Denoted at 71 is a projection optical system, and denoted at 72 is a water onto which the circuit pattern is to be transferred. Illumination light 73 from an illumination system 67 illuminates an illumination region 74 on the reticle 70 surface, and the circuit pattern formed in that region 74 is transferred by the projection optical system 71 onto an exposure region 75 on the wafer 72 in the reduced scale. The step-and-scan type exposure apparatus differs from conventional steppers in the following points.

In a step-and-repeat type exposure apparatus, a pattern of a reticle 70 is transferred to a wafer 72 at once, in a reduced scale. On the other hand, in a step-and-scan type exposure apparatus, a circuit pattern is illuminated with a slit-like shaped illumination region 74, and the reticle 70 and the wafer 72 are scanningly moved in synchronism with each other, by which the whole circuit pattern of the reticle is transferred to the wafer in a reduced scale.

The coordinate system is such as at 76, wherein the scan direction 77 of the reticle 70 corresponds a negative x axis direction, while the scan direction of the wafer 72 corresponds to a positive x axis direction. Denoted in the drawing at 79 is a birefringence correcting member which can be demountably mounted and can be replaced by another, like the embodiment of a stepper.

Since in a step-and-scan type exposure apparatus the illumination region 74 has a slit-like shape, the influence of compaction when illumination is made by use of an ArF laser does not appear symmetrically with respect to the optical axis.

Figure 18:
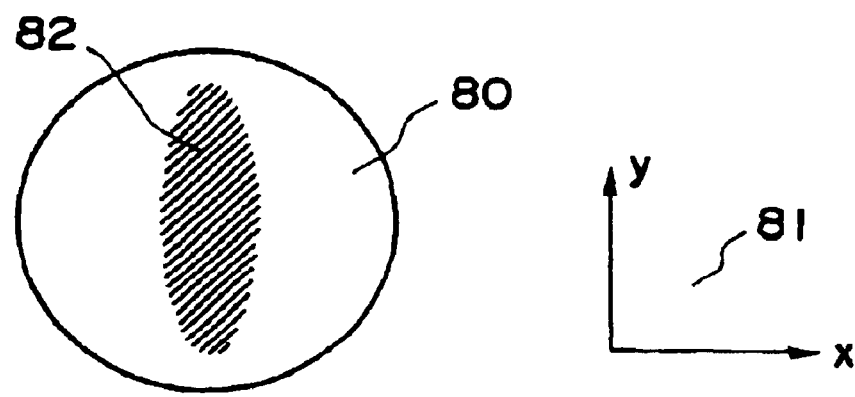
FIG. 18 is a schematic view for explaining an asymmetric distortion distribution produced in the projection exposure apparatus of the FIG. 17 embodiment.

Referring to FIG. 18, the light transmission region of a lens element of the projection optical system 71 will be explained. Denoted in the drawing at 80 is a representative lens element, being illustrated on an x-y plane with coordinates at 81.

Here, in accordance with the shape of the illumination region 74, the region on the lens element 80 through which the light passes has a shape, with hatching 82, being elongated in the y-axis direction. Thus, distortion attributable to compaction is produced in accordance with that shape. Also, the birefringence of the optical system produced as a result of it becomes, of course, asymmetric with respect to the optical axis.

Figure 19:
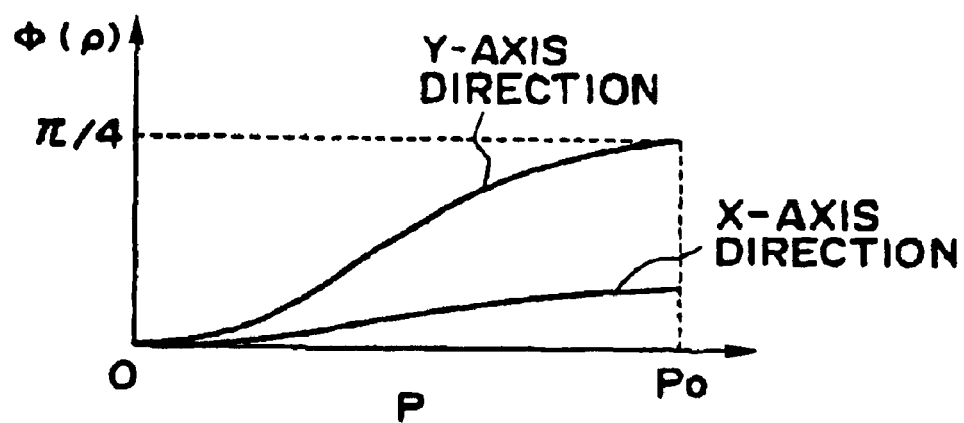
FIG. 19 is a graph for explaining an asymmetric distortion distribution produced in the projection exposure apparatus of the FIG. 17 embodiment.

The quantity of phase change due to birefringence, when depicted by use of pupil coordinates similar to that of FIG. 6, is such as shown in FIG. 19. Namely, it has different distributions in the x-axis direction and y-axis direction. Correction of such a distributed birefringence quantity can be met by using different groove depths, being different with respect to the x-axis and y-axis directions, such as described with reference to FIG. 14.

Next, another embodiment of a birefringence member according to the present invention will be described. With reference to the first embodiment of FIGS. 1–8, as regards the specific structure of birefringence correcting member 8, in consideration of the need that the material of the birefringence correcting member is transparent to exposure light and it has sufficient durability, the same material as the optical glass for the lens elements 1–5 is used. Also, for birefringence, the phenomenon called "form birefringence" is utilized.

As described with reference to the first embodiment, also in this embodiment, distortion remains in the manufacture of optical glass and, due to the influence of it, birefringence is produced. However, in this embodiment, as compared with the first embodiment, distortion is positively applied to an optical glass to thereby produce desired birefringence. This embodiment differs from the first embodiment only in this point, and the remaining structure and function are basically the same as that of the first embodiment.

Distortion can be left in the optical glass, by precisely controlling the temperature during an annealing process. Usually, the annealing process is performed so as to remove distortion remaining in the optical glass. However, in production of a birefringence correcting member of the present invention, the annealing process is used, on the contrary, to produce residual distortion.

The annealing process will be described with reference to FIGS. 20A to 20F. Denoted in the drawing at 130 is an optical member which is going to be formed into a birefringence correcting member 8. The optical member 130 has a disk-like shape, and the position on the member is designated with the distance r from the central axis 131.

Figure 20:
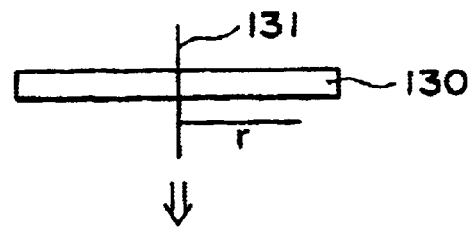
FIGS. 20A through 20F are schematic views; for explaining birefringence correcting means according to another embodiment of the present invention.
Figure 20:
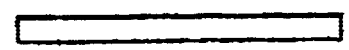
Figure 20:
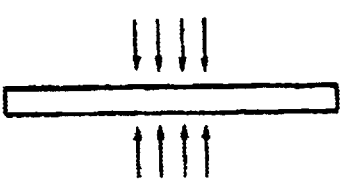
Figure 20:
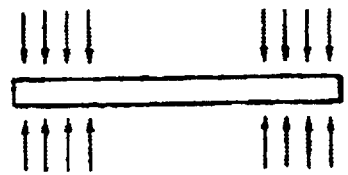
Figure 20:
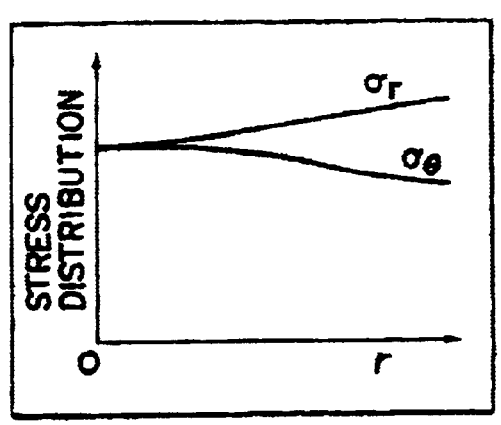
Figure 20:
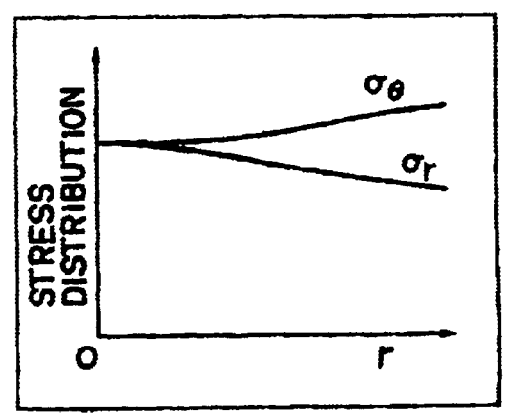

FIG. 20A illustrates the state before heating for the annealing process. FIG. 20B shows the state in which heat is uniformly applied to the whole optical member 130. In this state, there is substantially no stress distribution inside the optical member 130. During a cooling process shown in FIGS. 20C 20D, a large stress distribution can be produced. In FIG. 20C, gas flows to the central portion for quick cooling thereof. As a result of this, when the optical member 130 returns to room temperature, there is a large residual stress produced inside. FIG. 20E shows such a stress distribution.

The stress $\rho_r$ in the radial direction and stress $\sigma_\theta$ in the circumferential direction are depicted as a function of the radius r. They coincide with each other at the center. There is a difference between them which increases with enlargement of radius r. If an object having such a stress difference is inserted into the optical path, a phase difference as can be calculated by equation (2) is produced.

Here, the stress distribution which should be produced in the optical member is adjusted to a value which is effective to cancel the phase difference due to the birefringence of the whole projection optical system, as shown in FIG. 6. To this end, the temperature of gas to be blown, the blowing position and the temperature after gas blowing should be controlled exactly. Optimum conditions therefor can be determined on the basis of experiments. As an example, with quick cooling by blowing air to the peripheral portion such as illustrated in portion of FIG. 20D, a stress distribution such as shown in of FIG. 20F is obtainable.

For producing residual stress in birefringence correcting member 8, the temperature distribution control for an annealing process may be replaced by changing the impurity density of the optical member 130 in the radial direction. Similar advantageous effects are attainable with the latter method. Further, a dynamic pressure may be externally applied to a disk-like glass material member or a lens element or elements, by which a desired inside stress distribution can be provided.

Figure 21:
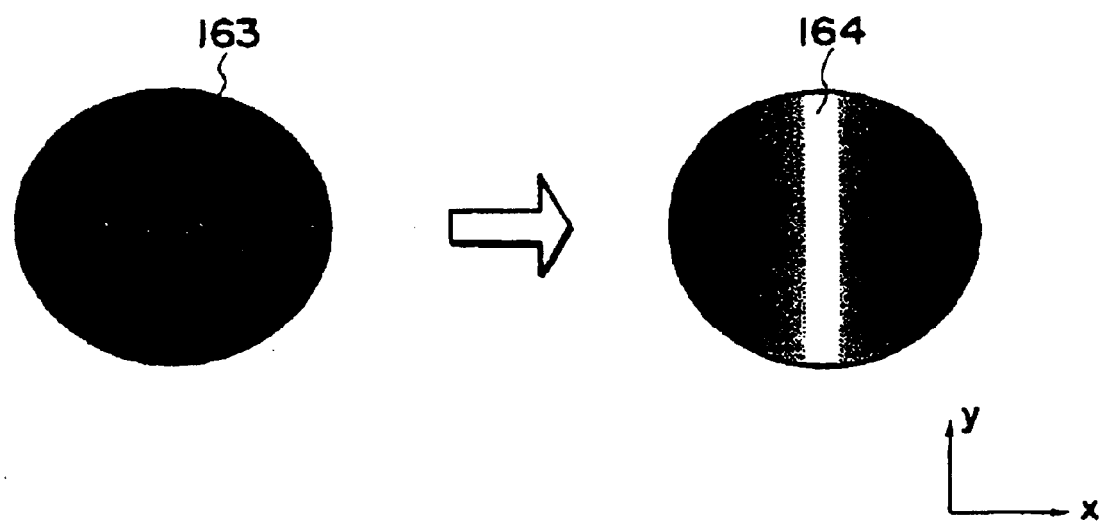
FIG. 21 is a schematic view for explaining birefringence correcting means according to an embodiment of the present invention.

In the step-and-scan type exposure apparatus shown in FIG. 17, there may be produced birefringence in the projection optical system which is asymmetric with respect to the optical axis. Referring to FIG. 21, the manner of correcting asymmetric birefringence by using a birefringence correcting member of the present embodiment in such an exposure apparatus, will now be explained.

Like the example of FIGS. 20A to 20F, the birefringence of the correcting member is adjusted by controlling the temperature distribution during the annealing process. Reference numeral 163 in FIG. 21 denotes the state in which heat is uniformly applied to the whole during the annealing process. Reference numeral 164 denotes the state after cooling, with different temperature distributions defined in the x and y directions. In this state, the residual distortion inside the member has different distributions in the x and y directions. By inserting such a member into the projection optical system, the influence of birefringence produced asymmetrically with respect to the optical axis of the optical system can be corrected.

Next, an embodiment of a device manufacturing method which uses a projection exposure apparatus such as described above, will be explained FIG. 22 is a flow chart of a procedure for the manufacture of microdevices such as semiconductor chips (e.g., ICs or LSIs), liquid crystal panels, or CCDs, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 23:
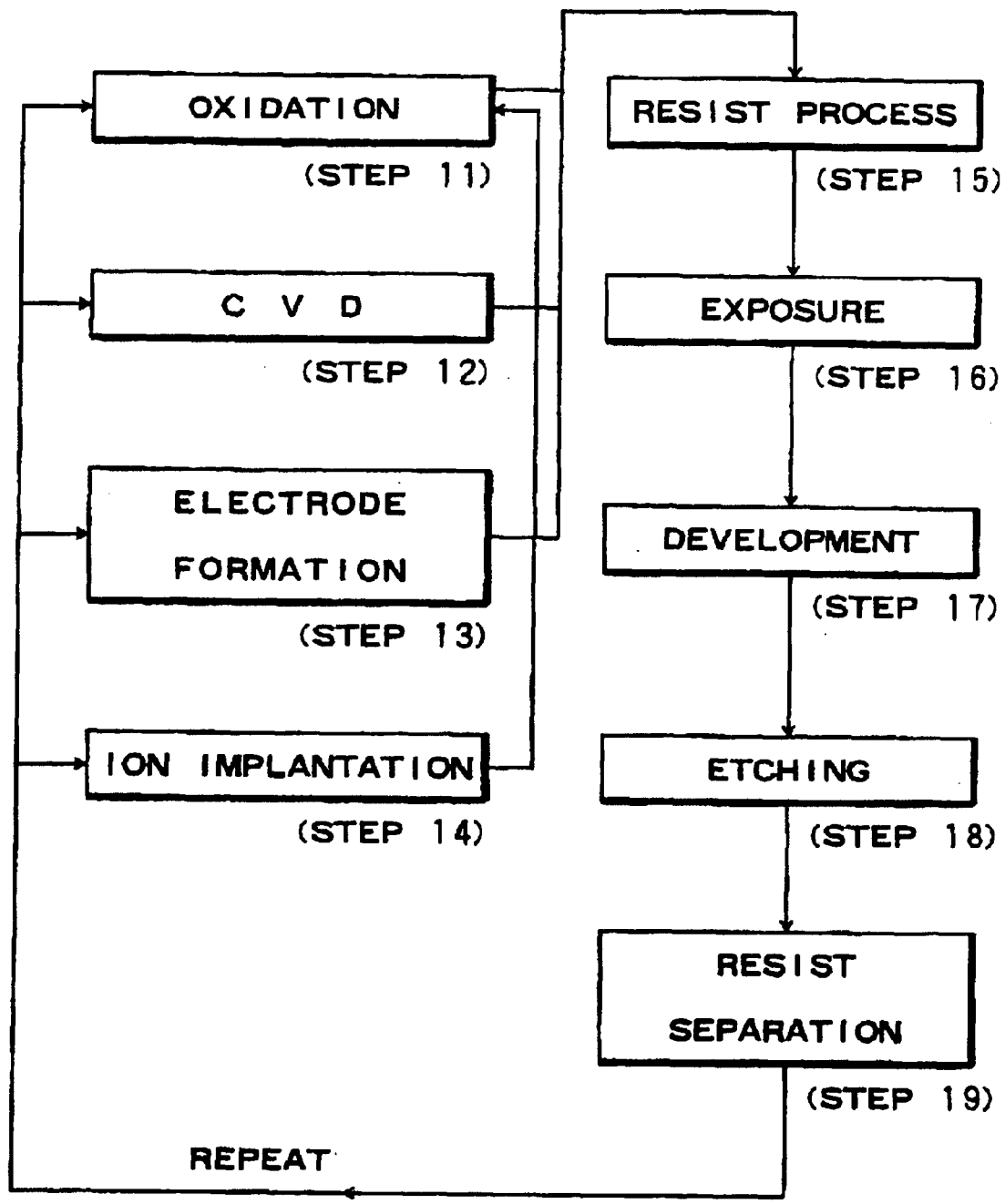
FIG. 23 is a flow chart for explaining details of a wafer process in the procedure of FIG. 22.
Figure 24:
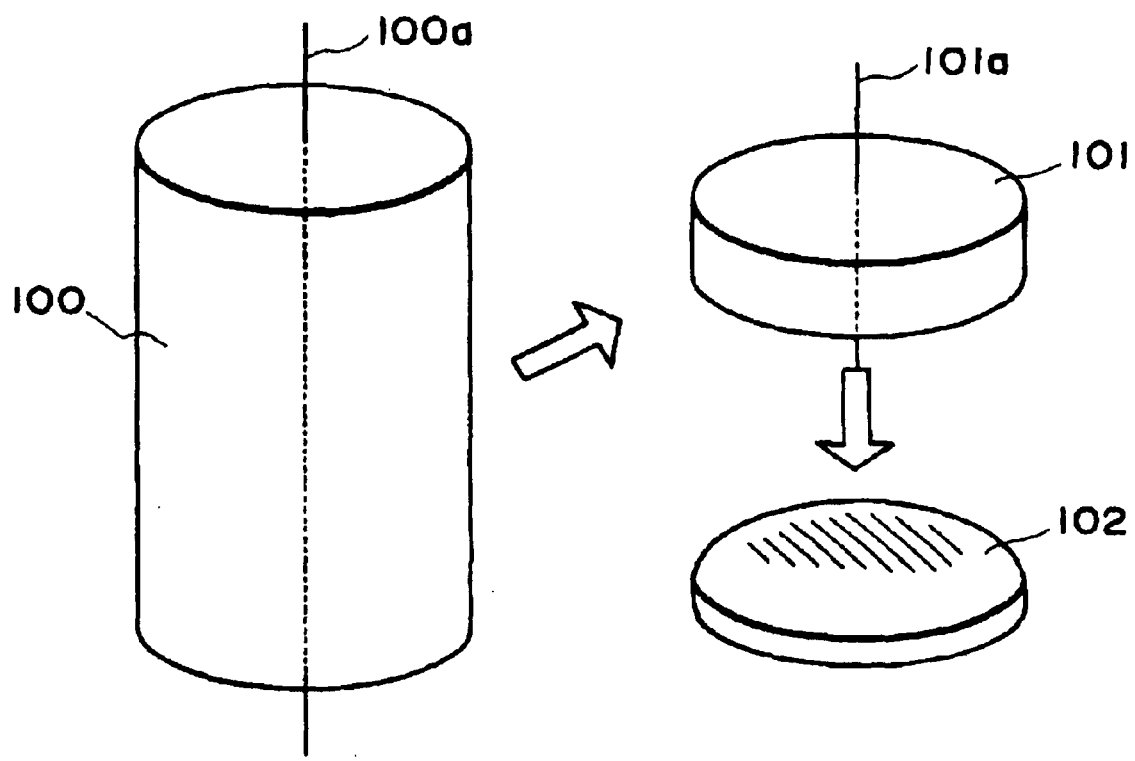
FIG. 24 is a schematic view for explaining lens element manufacturing processes.
Figure 25:
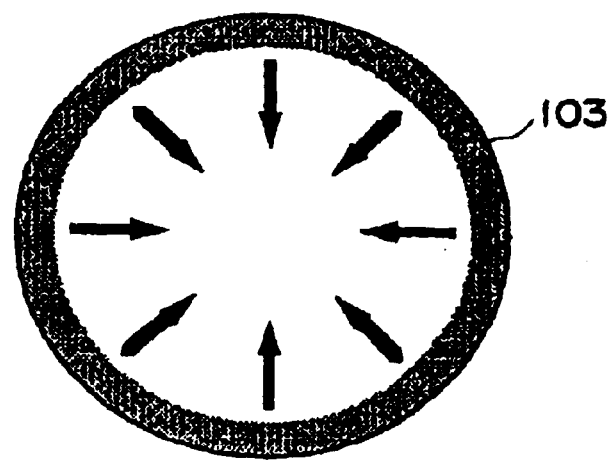
FIG. 25 is a schematic view for explaining inside distortion produced by influence of impurities.
Figure 26:
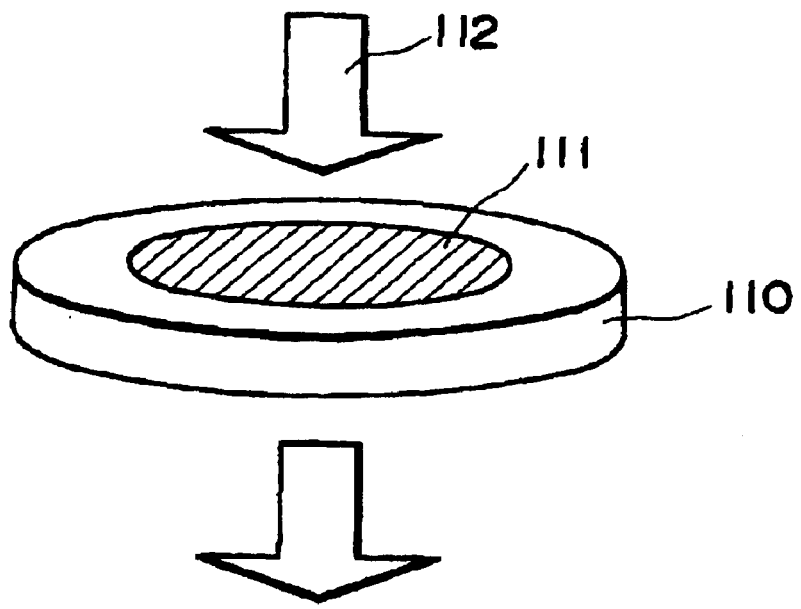
FIG. 26 is a schematic view for explaining the phenomenon of compaction.
Figure 27:
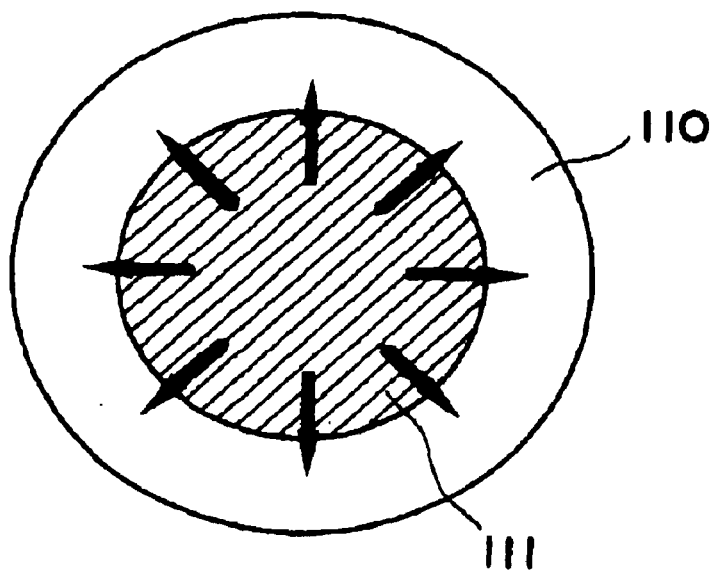
FIG. 27 is a schematic view for explaining inside distortion produced by influence of compaction.

FIG. 23 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

In accordance with the embodiments of the present invention as described above, a birefringence correcting member being set appropriately is provided in a projection optical system. This enables superior correction of the birefringence property of a projection optical system itself or birefringence produced during the projection exposure process. Thus, the present invention provides a projection optical system, a projection exposure apparatus having the same, or a device manufacturing method using it, by which high precision pattern transfer is assured.

Particularly, even in a case wherein birefringence is produced in a glass material which constitutes a projection optical system, the influence thereof can be corrected or compensated for such that high precision pattern transfer is assured. Further, the influence of distortion due to compaction, which is caused by absorption of ArF laser light, for example, by the glass material, can be corrected.

Figure 28:
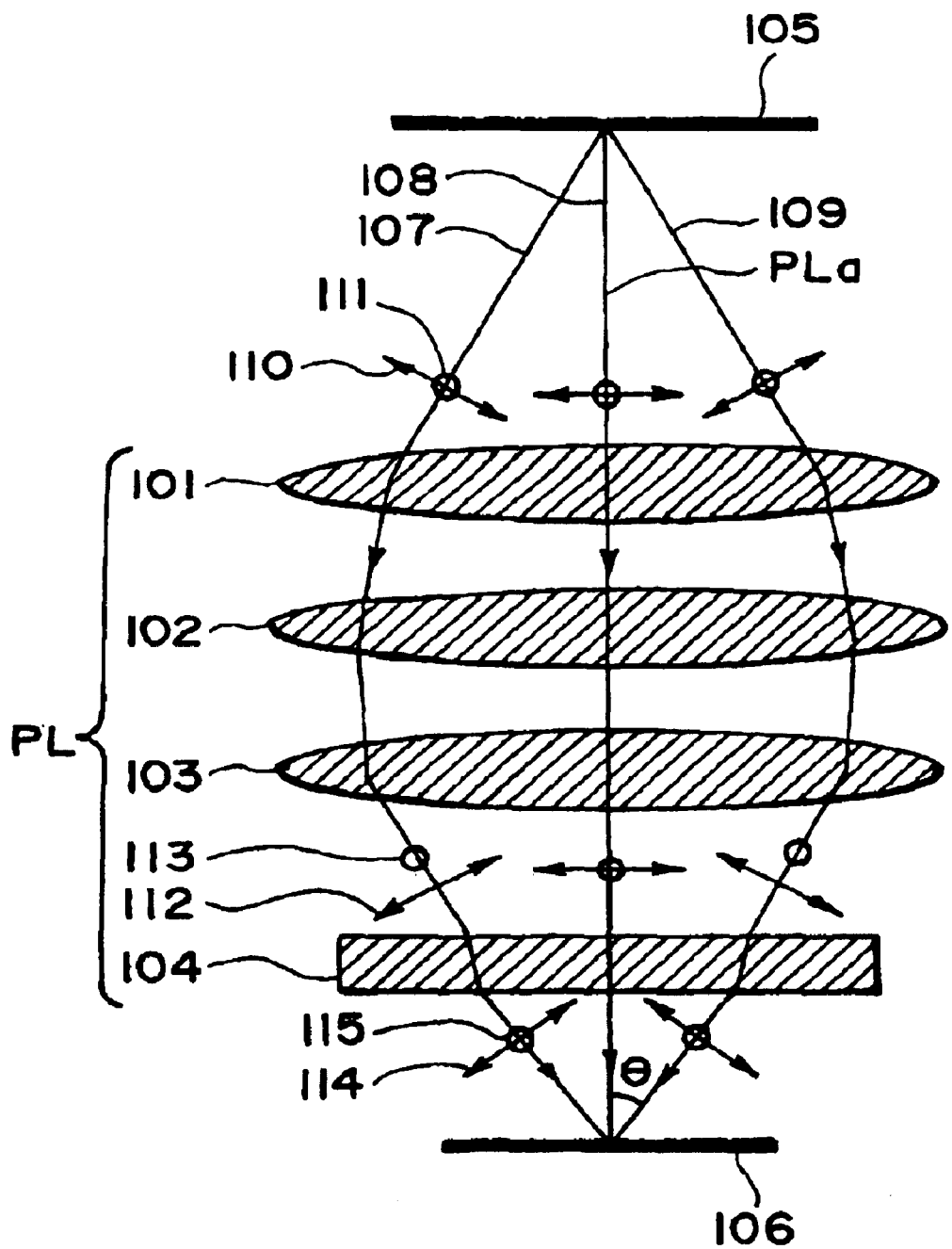
FIG. 28 is a schematic view of a main portion of a projection optical system according to a fourth embodiment of the present invention.

FIG. 28 is a schematic and sectional view of a main portion of a projection optical system according to a fourth embodiment of the present invention. This embodiment can be applied either to a step-and-repeat system or to a step-and-scan system. Denoted in FIG. 28 at PL is a projection optical system which usually comprises a few tens of optical elements having their aberrations corrected precisely. Here, the illustration is simplified, and lens elements 101–103 represent many optical elements.

Each of the lens elements 101–103 can be produced by cutting and polishing a quartz glass (fused silica). Denoted at 104 is a birefringence correcting member (correcting means). Denoted at 105 is a reticle, and denoted at 106 is a wafer. In operation, a pattern formed on the reticle 105 surface is projected in a reduced scale upon the wafer 106 surface, in accordance with a step-and-repeat method or step-and-scan method.

The projection optical system of this embodiment is provided with a birefringence correcting member 104 which comprises an optical element made of a uniaxial crystal having a principal axis extending along the optical axis direction or of an optical material having a distortion distribution equivalent to that of a uniaxial crystal. The thickness and the surface shape as well as the birefringence property of the birefringence correcting member 104 are so determined to cancel birefringence to be produced at any other lens element or elements.

Here, the fused silica constituting the lens elements 101–103 has such a double refraction property that the orientation of an advancement phase axis is distributed radially from the optical axis. In FIG. 28, for explanation of the influence of birefringence, three light rays 107, 108 and 109 emitted from a single point on the reticle 105 are illustrated. As regards the light ray 107, particularly, the polarization components before incidence upon the lens element 101 are specified at 110 and 111, while the polarization components after emission from the lens element 103 are specified at 112 and 113. Further, the polarization components after emission from the correcting member 104 are specified at 114 and 115. Here, the polarized lights 110, 112 and 114 denote the polarization components being parallel to the sheet of the drawing, while the polarized lights 111, 113 and 115 denote polarization components being perpendicular to the sheet of the drawing.

As shown in FIG. 28, the polarization components 110 and 111 before entering the lens element 103 have the same wavefront. However, as it passes through the three lens elements 101, 102 and 103, there occurs a shift (deviation) of wavefront between the polarization components 112 and 113. In the lens elements 101–103, the direction of vibration of electric field of the polarization component 112 is coincident with the advancement phase axis direction and, therefore, the wavefront of the polarization component 112 is relatively advanced as compared with that of the polarization component 113. If the light reaches the image plane (wafer surface) 106 while keeping this state, the imaging performance is degraded. In consideration of it, in this embodiment, the birefringence correcting member 104 is provided at the position inside the projection lens PL, which is closest to the image plane side, to correct any shift of wavefront produced between the polarization components 112 and 113. Thus, the light rays are transformed into two polarization components 114 and 115 having their wavefronts registered with each other, and they are projected upon the wafer 106 surface.

Figure 29:
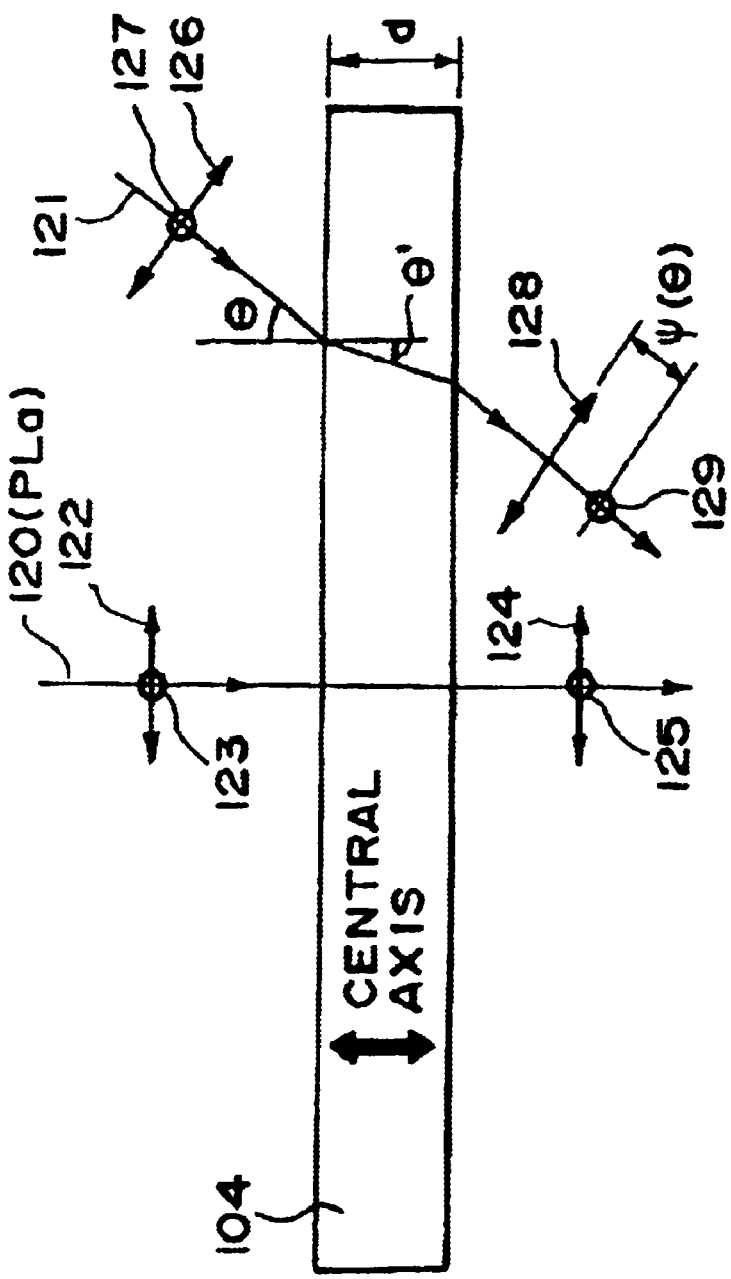
FIG. 29 is a schematic view for explaining a change in polarization state of light in the transmission through a birefringence correcting member according to the present invention.
Figure 30:
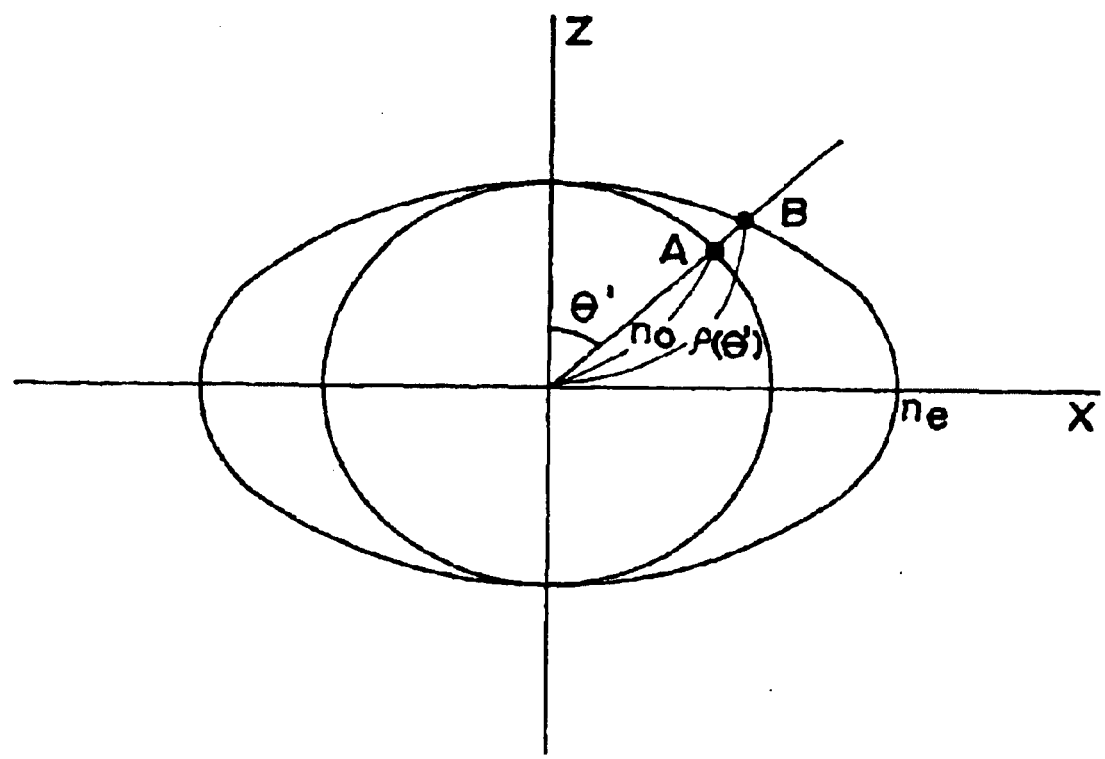
FIG. 30 is a schematic view for explaining a birefringence elliptical surface, in a positive uniaxial crystal glass material.

Referring to FIGS. 29 and 30, the optical function of the correcting member 104 will be described in detail. The correcting member 104 comprises a parallel flat plate, being made of a uniaxial crystal and having a thickness d. It is placed so that the crystal axis thereof (in this case, it corresponds to a principal axis and an optical axis) is registered with the optical axis PLa direction of the projection lens. As regards such a uniaxial crystal material having a high transmission factor in an ultraviolet region and having a good physical durability, magnesium fluoride ($MgF_2$) may be used, for example. In the drawings, a light ray 120 is illustrated as being perpendicularly incident on the correcting member 104, while a light ray 121 is illustrated as being incident on the correcting member 104 with an angle $\theta$.

As regards the light ray 120, if the polarization components before incidence are denoted at 122 and 123, these two polarization components 122 and 123 enter the correcting member 104 as an ordinary ray (field vibration direction being perpendicular to the principal axis). As a result, there occurs no wavefront shift between the polarization components 124 and 125 after being transmitted therethrough.

On the other hand, where the polarization components of the light ray 121 before incidence are denoted at 126 and 127, the polarization component 127 passes through the correcting member 104 as an ordinary ray whereas the polarization component 126 passes through the correcting member 104 as an extraordinary ray. Since the refractive index of the material of the correcting member 104 differs between an ordinary ray and an extraordinary ray, there occurs a deviation $\Psi(\theta)$ of wavefront between two polarization components 128 and 129, as illustrated.

Magnesium fluoride ($MgF_2$), for example, is a positive crystal, and the refractive index $n_e$ for an extraordinary ray becomes larger than the refractive index $n_o$ for an ordinary ray. Therefore, the wavefront of the polarization component 128 is relatively retarded as compared with that of the polarization component 129. FIG. 30 illustrates a refractive index ellipsoid wherein the refractive index of the uniaxial crystal is depicted on an X-Z plane. The refractive index of a light ray having an angle $\theta'$ with respect to the principal axis is given by a point A, in the case of an ordinary ray, whereas it is given by a point B in the case of an extraordinary ray. As for the refractive index of the extraordinary ray, a value where $\theta'=90$ deg. is taken as $n_e$. For a usual angle $\theta'$, it is taken as $\rho(\theta')$. It is clearly seen from the drawing that the refractive index with respect to a light ray changes with the direction $\theta'$ of the light ray inside the crystal. Here, the following relation can be derived.

$$\rho(\theta') = \frac{1}{\sqrt{\frac{\sin^2\theta'}{n_e^2} + \frac{\cos^2\theta'}{n_o^2}}} \tag{7}$$

If geometro-optical separation of light rays due to birefringence is disregarded, the incidence angle $\theta$ and the direction $\theta$ inside the crystal are interrelated with each other in accordance with Snell's law, i.e., $\sin \theta = n \sin \theta'$ where $n=(n_o+n_e)/2$. Thus, the wavefront shift $\Psi(\theta)$ can be expressed as:

$$\Psi(\theta) = \{[\rho(\theta')-n_o]d\}/\cos \theta' \tag{8}$$

Figure 31:
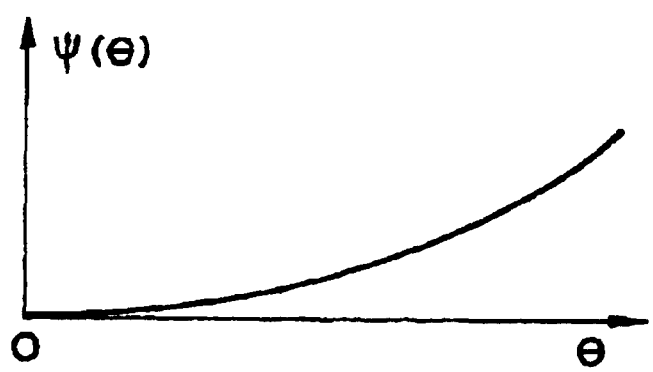
FIG. 31 is a graph for explaining the relationship between an incidence angle with respect to a birefringence correcting member and a birefringence correcting capacity thereof.

FIG. 31 illustrates this, in terms of a function of the angle $\theta$.

From the results described above, it is seen that the amount of wavefront shift between polarization components to be produced by the birefringence changes in accordance with the incidence angle of the light ray. When a positive uniaxial crystal such as shown in FIG. 29 is used, the wavefront of the polarization component parallel to the sheet of the drawing can be retarded as compared with the polarization component 127 which is perpendicular to the sheet of the drawing. Therefore, any shift of wavefront produced between the polarization components 112 and 113 in FIG. 28 can be corrected when they pass through the correcting member 104, as depicted by polarization components 114 and 115. While the above-described description concerns the light ray 107, a similar explanation applies also to the light ray 109.

As regards the light ray 108, it is not at all influenced, in terms of birefringence, by the lens elements 101–103 and the correcting member 104. Therefore, constantly it is directed from the object plane 105 to the image plane 106 in an idealistic state. If the influence of birefringence produced at the lens elements 101–103 is represented by $\Phi(\theta)$, the system can be set, with respect to the birefringence correction amount $\Psi(\theta)$ of the birefringence correcting member 104, as being represented by FIG. 31, so as to satisfy a relation of $\Phi(\theta)-\Psi(\theta)=0$.

In the present embodiment, as described above, the influence of birefringence of the glass material is corrected by means of the correcting member 104, by which potential imaging characteristics of the projection lens are realized.

In order to cancel any double refraction to be produced as a result of the influence of a glass material of a projection lens PL, it is necessary to control the amount of wavefront shift to be produced by the correcting member 104. To this end, the value of the difference "$n_e-n_o$" in refractive index between ordinary and extraordinary rays or, alternatively, the thickness d may be changed. However, where the correcting member 104 is made of $MgF_2$, for example, the value of the refractive index difference $n_e-n_o$ is determined definitely. Therefore, the parameter d for plate thickness is only the parameter to be controlled.

Here, determination of the plate thickness d will be described, with reference to a case where $MgF_2$ is used for the material of the correcting member 104.

According to the data discussed in "HANDBOOK OF OPTICS II, Second Edition" (ISBN 0-07-047974-7), Chapter 33 (P. 33.64), it is suggested that the wavelength dependency of the refractive index of $MgF_2$, with respect to an ordinary ray and an extraordinary ray, is as follows (the unit of the wavelength $\lambda$ is $\mu$m):

$$n_o = \sqrt{1 + \frac{2.31204\lambda^2}{-566.136+\lambda^2} + \frac{0.39875\lambda^2}{-0.00895189+\lambda^2} + \frac{0.487551\lambda^2}{-0.00188218+\lambda^2}}$$

$$n_e = \sqrt{1 + \frac{2.49049\lambda^2}{-163.124+\lambda^2} + \frac{0.504975\lambda^2}{-0.00823767+\lambda^2} + \frac{0.41344\lambda^2}{-0.00135738+\lambda^2}}$$

When an ArF excimer laser is used as a light source, a value $\lambda=0.193$ ($\mu$m) is substituted into the equations abode, such that the ordinary ray refractive index $n_o=1.427670$ and the extraordinary ray refractive index $n_e=1.441134$. By substituting these values into equation (8) via equation (7), we obtain:

$$\Phi(\theta) = \left(-1.42767 + \frac{1}{\sqrt{0.490619 - 0.0044348\sin^2\theta}}\right) \times$$

$$\left(\frac{d}{\sqrt{1 - 0.486024\sin^2\theta}}\right)$$

If a case wherein the numerical aperture NA at the image side is NA=0.7 is considered, the largest value for the angle $\theta$ will be, because of $\sin\theta=0.7$, approximately equal to 45 deg. Assuming d=1 mm and calculating the change of $\Psi(\theta)$ within the range $0\leq\theta\leq45$ (deg.), we obtain the relationship as illustrated in FIG. 32A. Thus, when a thickness of 1 mm is chosen for the correcting member 104, in relation to light rays (such as light rays 107 and 109 in FIG. 28) passing through a peripheral portion of the projection lens PL and impinging on the image plane with an angle 45 deg., correction of a wavefront deviation, due to birefringence, of a magnitude 0.0037 mm can be accomplished. Here, it will be readily understood from the equation above that the thickness d and the birefringence correction amount $\Psi(\theta)$ are in a proportional relation with each other.

As regards the wavefront deviation due to birefringence as produced at the glass material of the projection lens PL, other than the correcting member 104, qualitatively it can be expressed by a function $\Phi(\theta)$ ($\theta$ is the angle of light ray). Specifically, if the amount of birefringence of the glass material at the position where the light rays 107 and 109 in FIG. 28 pass through is 2 nm/cm and the total length through which the light rays 107 and 109 pass the glass material is 50 cm, then the amount of wavefront deviation between the polarization components 112 and 113 will be about 100 nm. When the correcting member 104 has a thickness of 1 mm, wavefront deviation correction due to birefringence of an amount 0.0037 mm can be accomplished. Thus, for correction of a wavefront deviation of 100 nm, the correcting member 104 should have a thickness d which is approximately equal to 27 microns. However, placing and holding such a very thin element alone in the projection lens is very difficult. In consideration of it, in this embodiment, $MgF_2$ material of a thickness d is provided on a transparent substrate, such as illustrated in FIG. 32B. More specifically, a $MgF_2$ layer may be formed by vapor deposition and with a thickness d, upon a substrate of fused silica or $CaF_2$ having no double refraction property, by which a desired structure can be accomplished. When the influence of birefringence is disregarded, the influence of a change in thickness d, a an order of micron, to the aberration of the optical system can be disregarded. Therefore, the thickness d of the correcting member 104 can be determined on the basis of the magnitude of birefringence actually produced in the projection optical system.

Figure 33:
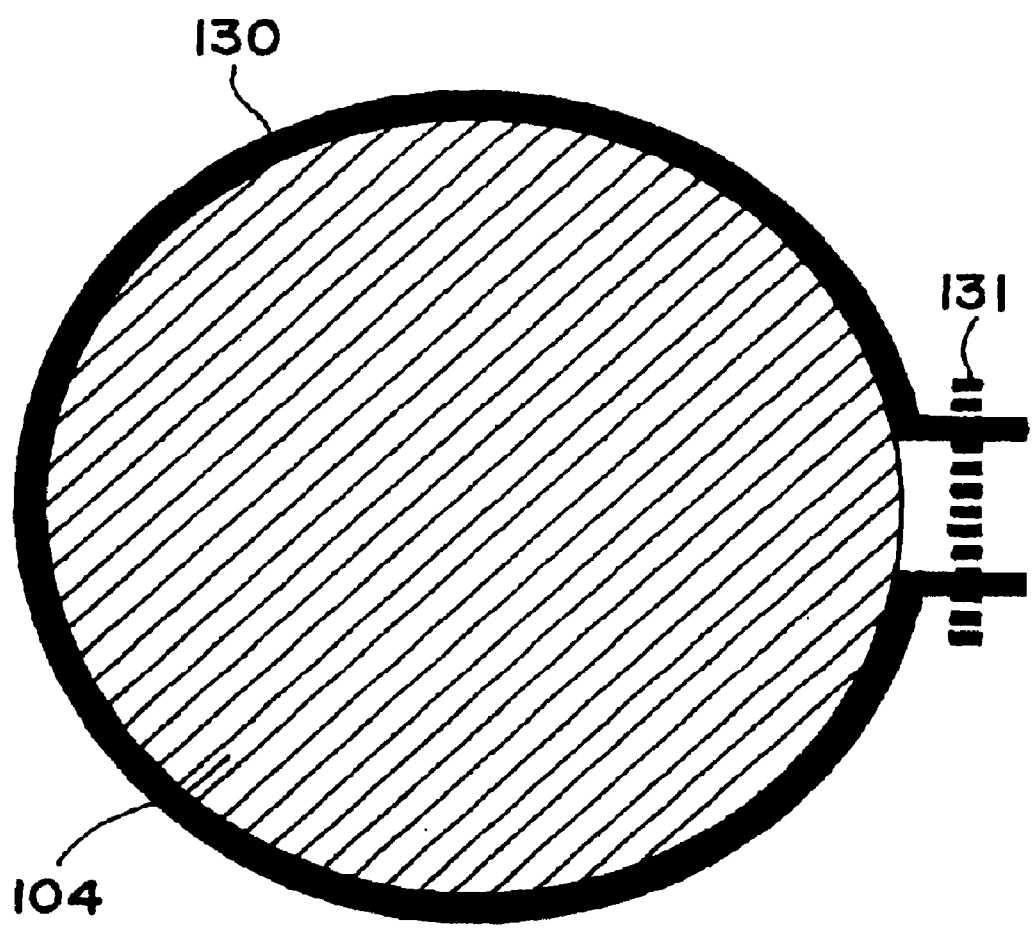
FIG. 33 is a schematic view for explaining birefringence correcting capacity adjusting means for a birefringence correcting member.

The birefringence correction amount can be adjusted not by adjusting the thickness d of the correcting member 104 as described, but by changing, through any dynamic means, the difference between the ordinary ray refractive index $n_o=1.427670$ and an extraordinary ray refractive index $n_e=1.441134$ which the $MgF_2$ crystal normally possesses. FIG. 33 shows such an example wherein stress adjusting means 130 is provided around a correcting member 104.

While $MgF_2$ is a positive uniaxial crystal, the difference in refractive index (i.e., $n_o-n_e$) can be reduced by applying forces uniformly and inwardly from the outside periphery of a circular flat plate. According to this method, the birefringence correction capacity can be made variable, by changing the magnitude of the refractive index difference "$n_o-n_e$" while holding the plate thickness d constant. The stress adjusting means 130 comprises a metal belt which is fixed to the periphery of the correcting member 104. With the aid of a screw 131, it functions to uniformly and inwardly apply forces to the peripheral portion of the correcting member 104.

In accordance with the principle and arrangement described above, to a glass material such as $CaF_2$ or fused silica which normally has no birefringence characteristic, a double refraction property equivalent to a uniaxial crystal can be imparted. Thus, the correction capacity to birefringence as produced by any other lens element in a projection lens can be made variable continuously in a wide range.

The embodiment described above has been explained with reference to an example wherein the lens elements constituting the projection lens have an advancement phase axis distribution, extending radially in the optical axis direction. However, in a case wherein the advancement phase axis is distributed concentrically with respect to the optical axis, the sign of birefringence to be corrected is inverted, such that use of a negative uniaxial crystal for the correcting member 104 is necessary. However, practically, there is no negative uniaxial crystal which has a high transmission factor with respect to the ultraviolet region and which satisfies conditions such as physical strength, for example. For this reason, the method having been described with reference to FIG. 33 may be used in combination with a glass material such as fused silica or $CaF_2$, for example, which normally shows no birefringence property. By applying uniform forces inwardly to the peripheral portion of a flat plate, the function equivalent to that of a negative uniaxial crystal can be provided.

Further, although the correcting member 104 has been explained above as being a parallel flat plate, for correction of very fine birefringence not cancelled by adjustment of refractive index solely, the surface of the correcting member may be formed into a spherical shape or an aspherical shape.

Figure 34:
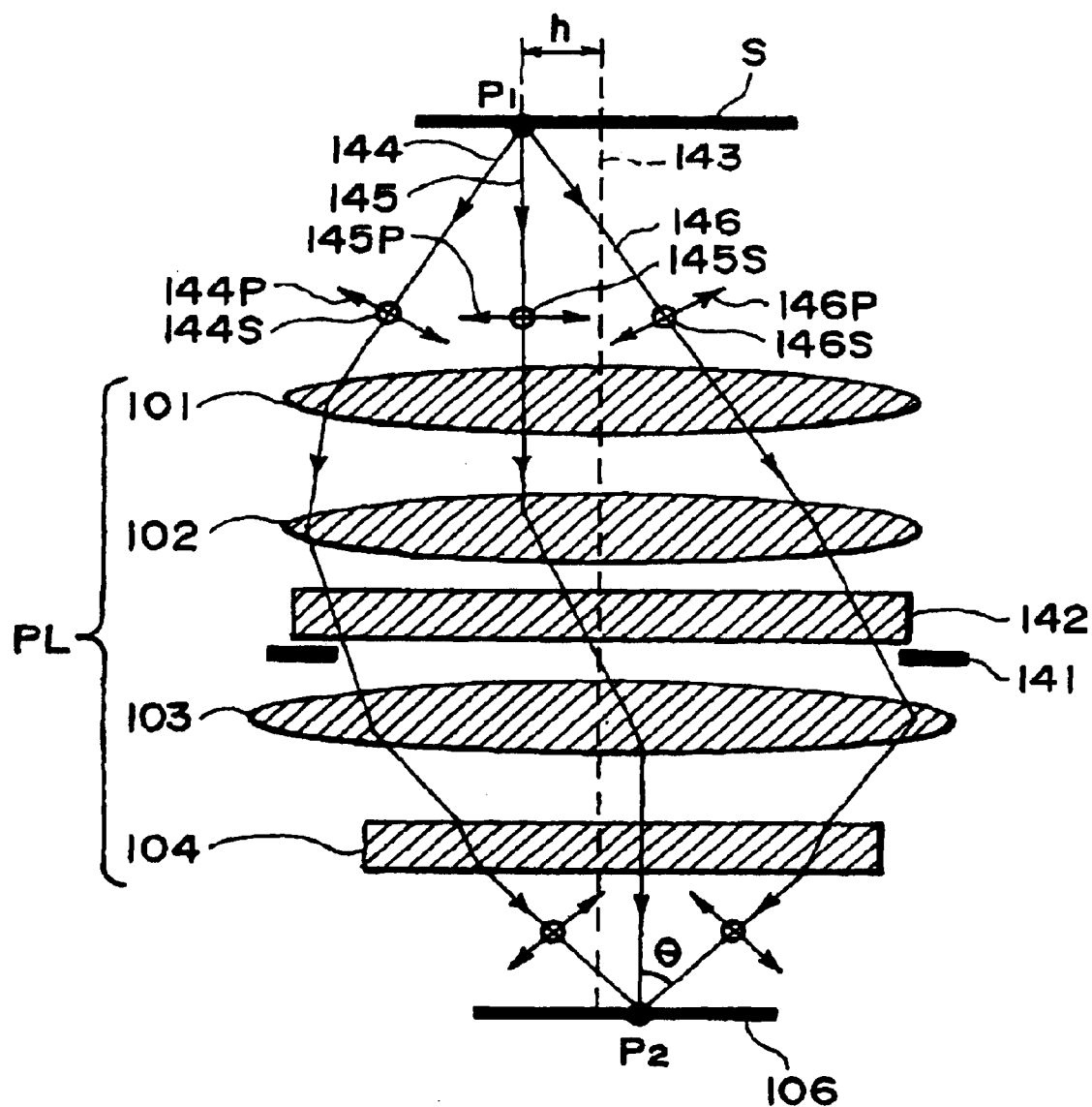
FIG. 34 is a schematic view of a main portion of a projection exposure apparatus according to a fifth embodiment of the present invention.

FIG. 34 is a schematic view of a main portion of a fifth embodiment of the present invention. This embodiment is a modified and improved form of the fourth embodiment shown in FIG. 28. This embodiment differs from the fourth embodiment of FIG. 28 in that, in addition to the correcting member 104 disposed between the image plane side final face of the lens and the wafer surface, there is a second birefringence correcting member 142 adjacent to a stop 141.

The preceding fourth embodiment has been explained with reference to an example wherein the object point and the image point are defined on the optical axis of the projection lens PL. In many cases, a projection exposure apparatus uses a projection optical system which is telecentric on its image side. In such a projection optical system, as shown in FIG. 35, chief rays (principal rays) 150 and 151 at different image heights are incident on a parallel flat plate perpendicularly, regardless of the image height. Also, the expansion of light rays around the chief ray does not change with the image height. Therefore, basically, in accordance with the method described with reference to the preceding embodiment, a birefringence property with respect to any off-axis object point can also be corrected like that for the on-axis object point.

In FIG. 34, however, the influence of birefringence to three light rays 144, 145 and 146 emitted from an object point P1, outside the optical axis 143, and directed to an image point P2, differs from the influence in relation to an on-axis object point, as follows. First, as regards the chief ray 145, since it does not always go along the optical axis 143 of the projection lens P1 where there is no birefringence, there occurs a wavefront deviation in dependence upon the difference in polarization direction. Second, as regards the chief ray 144, since it passes through a peripheral portion of the lens where the magnitude of birefringence is relatively large as compared with that for the light ray 146, the influence of birefringence becomes large as a consequence. Thus, if only the influences of the lens elements 101, 102 and 103 are considered, a wavefront deviation $\Psi(\theta)$ which appears between the polarization components 144P, 145P 146P parallel to the sheet of the drawing and the polarization components 144S, 145S and 146S perpendicular to the sheet of the drawing, will be such as illustrated in FIG. 36. As regards the birefringence property that can be corrected by the correcting member 104, with respect to a chief ray of $\theta=0$, basically it is limited to one having a magnitude zero and having a distribution of a laterally symmetric shape. Therefore, sufficient correction will not be attainable, with respect to the distribution as shown in FIG. 36.

Figure 37:
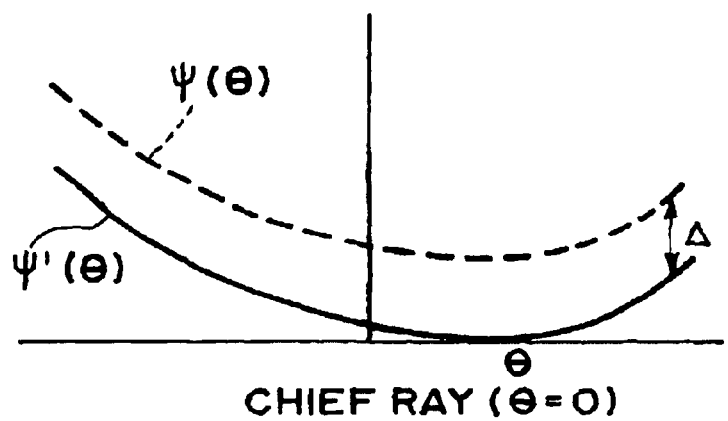
FIG. 37 is a graph for explaining the effect of a second birefringence correcting member.

In the fifth embodiment, in consideration of it, the second birefringence correcting member 142 is used to transform, with regard to the light from the off-axis object point P1, the distribution of the wavefront deviation $\Psi(\theta)$ as shown in FIG. 36 into a distribution of $\Psi'(\theta)$ such as shown in FIG. 37. Here, the second birefringence correcting member 142 is made of a uniaxial optical crystal being disposed so that, like the correcting member 104, the crystal axis thereof (in this example, it corresponds to a principal axis or an optic axis) is oriented along the optical axis direction. Alternatively, it may be made of a glass material having a property equivalent to the uniaxial crystal. Since the three light rays 144, 145 and 146 are incident on the correcting member 142 substantially at the same angle, it provides an effect that the distribution of wavefront deviation $\Psi(\theta)$ shown in FIG. 36 is uniformly lowered by an amount corresponding to the deviation amount $\Delta$. Here, the magnitude of the deviation amount $\Delta$ can be adjusted in accordance with the thickness of the correcting member 142 or the magnitude of the birefringence which the correcting member 142 possesses, this being exactly the same as has been described with reference to the correcting member 104 of the fourth embodiment.

The magnitude of birefringence to be corrected by the correcting member 142 is practically variable with a distance h of the object point P1 from the optical axis 143. If the value of distance h changes, it causes a change in incidence angle of light emitted from the object point P1 and incident on the correcting member 142. As a result, the birefringence correction amount of the correcting member 142 changes accordingly. Thus, the optical system can be arranged to ensure optimum correction with respect to every object height. Since the light emitted from an object point on the optical axis 143 is incident on the correcting member 142 substantially perpendicularly, the birefringence correction amount of the correcting member 142 for that light becomes substantially equal to zero. Thus, in this case, the influence of birefringence is corrected by the correcting member 104 only.

By use of the correcting member 104 (first correcting member) and the correcting member 142 (second correcting member) in combination as described above, the influence of birefringence produced in relation to an off-axis object point can also be is corrected very precisely. It should be noted however that, with regard to the off-axis object point, as illustrated in FIG. 37, the asymmetry of the distribution around the chief ray cannot be completely corrected even by use of the correcting member 142.

Figure 38:
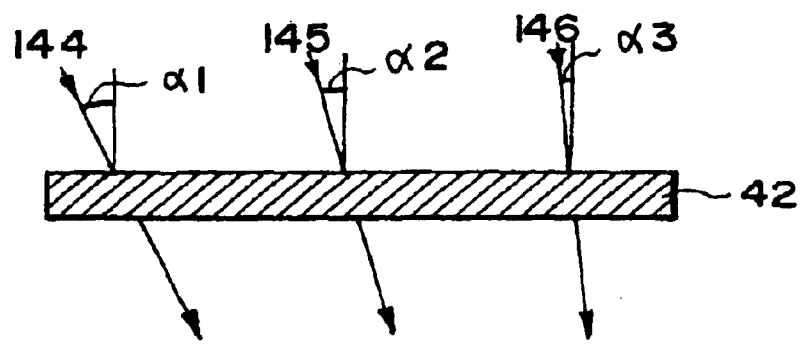
FIG. 38 is a schematic view for explaining incidence angles of light rays in a case where a second birefringence correcting member is placed in a convergent light flux.

In consideration of it, the correcting member 142 may be used particularly to such a portion where the light rays 144, 145 and 146 are converged as best seen in FIG. 38. If the angles with which the light rays 144, 145 and 146 are incident on the correcting member 142 are denoted by α1, α2 and α3, respectively, there is a relation α1>α2>α3. Thus, the system can be designed so that, with regard to the birefringence correction amount, it becomes largest with respect to the light ray 144 while it becomes smallest with respect to the light ray 146.

Figure 39:
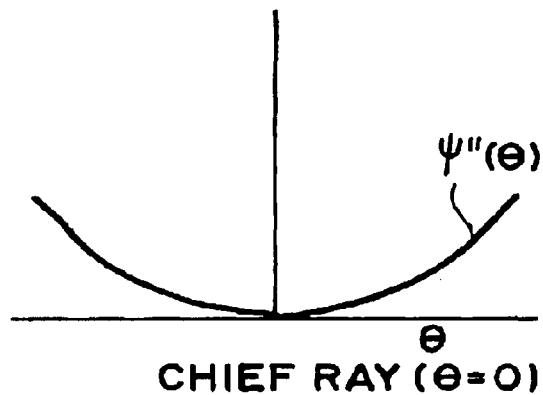
FIG. 39 is a graph for explaining the effect of a second birefringence correcting member.

As a result of the above, the distribution Ψ(θ) such as shown in FIG. 36 can be transformed into a distribution substantially completely symmetrical about the chief ray, such as a distribution Ψ"(θ) shown in FIG. 39. Thus, in combination with the correcting member 104, high precision correction can be accomplished even with regard to an off-axis object point, like for an on-axis object point. It should be noted that two or more correcting members may be used to provide birefringence correction, respectively.

FIG. 40 is a schematic view of a main portion of a sixth embodiment wherein a projection optical system according to the present invention is incorporated into a stepper. Denoted in the drawing at 160 is a reticle having a circuit pattern formed thereon, and denoted at 161 is a projection optical system according to the present invention. Denoted at 162 is a wafer onto which the circuit pattern of the reticle is to be transferred. Illumination light 163 from an illumination system 167 illuminates an illumination region 164 defined on the reticle 160, such that the circuit pattern formed in that region 164 is transferred in a reduced scale by the projection optical system 161 onto an exposure region 165 of the wafer 162. In a stepper, after a pattern of the reticle 160 is simultaneously transferred to the wafer 162 in reduction scale, the wafer is moved stepwise through a predetermined distance and, subsequently, the exposure process is performed. This operation is made repeatedly. The projection optical system 161 includes a birefringence correcting member of the present invention, such that the influence of birefringence of a glass material can be corrected and high precision imaging performance is assured.

Figure 41:
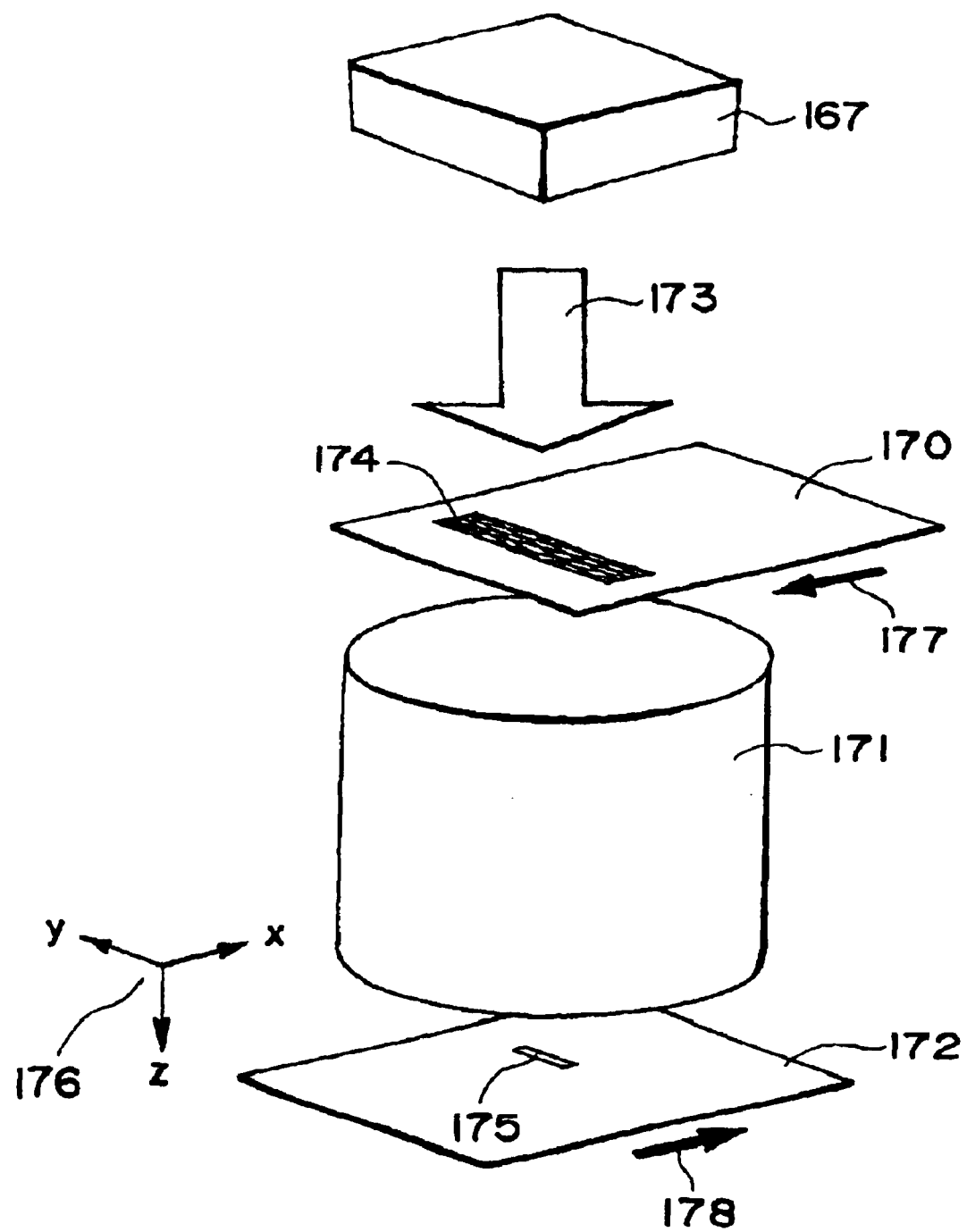
FIG. 41 is a schematic view of a main portion of a scanner (step-and-scan exposure apparatus) with a projection optical system, according to a seventh embodiment of the present invention.

FIG. 41 is a schematic view of a main portion of a seventh embodiment wherein a projection optical system according to the present invention is incorporated into a step-and-scan type exposure apparatus. Denoted in the drawing at 170 is a reticle having a circuit pattern formed thereon. Denoted at 171 is a projection optical system, and denoted at 172 is a wafer onto which the circuit pattern of the reticle is to be transferred. Illumination light 173 from an illumination system 167 illuminates an illumination region 174 defined on the reticle 170, such that the circuit pattern formed in that region 174 is transferred a reduced scale by the projection optical system 171 onto an exposure region 175 of the wafer 172. A step-and-scan type exposure apparatus differs from conventional steppers, in the following points.

In a stepper, the pattern of a reticle 170 is simultaneously transferred to a wafer 172 in a reduced scale. In a step-and-scan type exposure apparatus, as compared therewith, the circuit pattern of the reticle is illuminated with an illumination region 174 of a slit-like shape while, on the other hand, the reticle 170 and the wafer 172 are scanned in synchronism with each other, by which the whole circuit pattern of the reticle 170 is transferred to the wafer in a reduced scale. The projection optical system 171 includes a birefringence correcting member of the present invention, such that the influence of birefringence or a glass material can be corrected and high precision imaging performance is assured.

Figure 22:
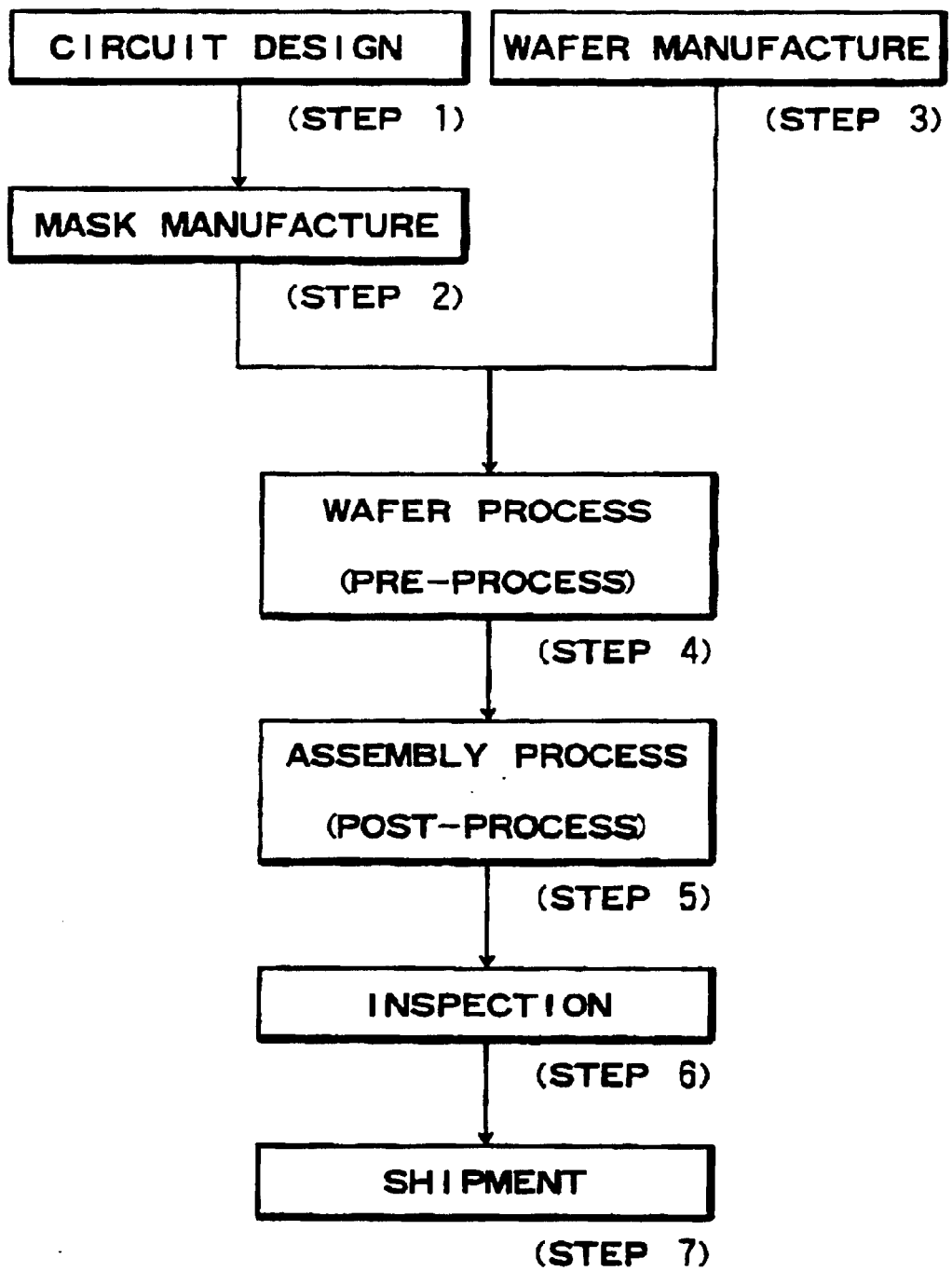
FIG. 22 is a flow chart of a device manufacturing procedure according to an embodiment of the present invention.

Semiconductor devices such as semiconductor chips (e.g., IC or LSI), liquid crystal panels or CCDs, for example, can be manufactured by using a projection exposure apparatus as has been described with reference to any one of FIGS. 28–41. The procedure may include an exposure process for printing a device pattern of a reticle on a wafer, and a process for developing the exposed wafer, such as shown in FIGS. 22 and 23.

In summary, in accordance with the embodiments of the present invention as have been described with reference to FIGS. 28–41, the following advantageous results are attainable.

(1) A projection optical system having a plurality of lens elements and including at least one birefringence correcting member which is made of a uniaxial crystal having a principal axis in an optical axis direction of the projection optical system, and/or of a material having a distortion distribution equivalent to the uniaxial crystal, wherein the property of the at least one birefringence correcting member is determined so as to cancel birefringence to be produced in relation to at least one of the lens elements.

(2) A projection optical system having a plurality of lens elements and including at least one birefringence correcting member, wherein the property of the at least one birefringence correcting member is determined so as to cancel birefringence to be produced in relation to at least one of the lens elements.

(3) A projection optical system having a plurality of lens elements and including a variable-birefringence member.

While the invention has been described with reference to the structures disclosed herein, it is not confined to the details set forth and this application is intended to cover such modifications or changes as may come within the purposes of the improvements or the scope of the following claims.

What is claimed is:

1. A projection optical system comprising:
   a plurality of lenses that cause birefringence; and
   at least one optical element having a stress distribution, the stress distribution substantially eliminating the birefringence caused by said plurality of lenses, wherein said at least one optical element is disposed between said plurality of lenses and an image plane of said projection optical system.

2. An optical system according to claim 1, wherein said at least one optical element has form birefringence.

3. An optical system according to claim 1, wherein the amount of birefringence of said at least one optical element is substantially the same as the amount of birefringence of said plurality of lenses as a whole, and wherein the sign of birefringence of said at least one optical element is opposite to the sign of said plurality of lenses as a whole.

4. An optical system according to claim 1, wherein said at least one optical element comprises a transparent plane plate.

5. A projection exposure apparatus comprising:
   an illumination system for illuminating a reticle with light; and
   a projection optical system for projecting a pattern of the reticle onto a wafer, said projection optical system including a plurality of lenses that cause birefringence, and at least one optical element for substantially eliminating the birefringence caused by said plurality of lenses, wherein said at least one optical element is disposed between said plurality of lenses and an image plane of said projection optical system.

6. A projection exposure apparatus according to claim 5, wherein said illumination system illuminates the reticle with slit-like light, and further comprising a scanning device for simultaneously scanning the reticle and the wafer in a widthwise direction of the slit-like light, at a speed ratio corresponding to a projection magnification of said projection optical system.

7. A projection exposure apparatus according to claim 5, wherein said at least one optical element has form birefringence.

8. An apparatus according to claim 7, wherein the amount of birefringence of said at least one optical element is substantially the same as the amount of birefringence of said plurality of lenses as a whole, and wherein the sign of birefringence of said at least one optical element is opposite to the sign of said plurality of lenses as a whole.

9. A device manufacturing method, comprising the steps of:

exposing a wafer with a device pattern by use of a projection exposure apparatus as recited in claim 8; and developing the exposed wafer.

10. A projection exposure apparatus according to claim 7, wherein said at least one optical element produces the form birefringence by a grating having a period smaller than a wavelength used.

11. A projection exposure apparatus according to claim 5, wherein said at least one optical element has a stress distribution.

12. A projection exposure apparatus according to claim 11, wherein said at least one optical member is arranged so that a distribution, including a distribution of stresses produced by said at least one optical member, is effective to cancel the birefringence of said plurality of lenses.

13. A device manufacturing method comprising the steps of:

exposing a wafer to a device pattern by use of a projection exposure apparatus as recited in claim 5; and developing the exposed wafer.

14. A projection exposure apparatus according to claim 5, wherein said at least one optical element comprises a transparent plane plate.

15. A projection optical system comprising:

a plurality of lenses that cause birefringence; and at least one optical element having a stress distribution, the stress distribution substantially eliminating the bireflingence caused by said plurality of lenses, wherein said at least one optical element is disposed near a pupil of said projection optical system.

16. An optical system according to claim 15, wherein said at least one optical element comprises at least one element having a stress distribution.

17. An optical system according to claim 15, wherein said at least one optical element comprises a transparent plane plate.

18. A projection exposure apparatus comprising:

an illumination system for illuminating a reticle with light; and a projection optical system for projecting a pattern of the reticle onto a wafer, said projection optical system having a plurality of lenses that cause birefringence, and at least one optical element for substantially eliminating the birefringence caused by said plurality of lenses, wherein said at least one optical element is disposed near a pupil of said projection optical system.

19. A device manufacturing method, comprising the steps of:

exposing a wafer to a device pattern by use of a projection exposure apparatus as recited in claim 18; and developing the exposed wafer.

20. A projection exposure apparatus according to claim 18, wherein said at least one optical element comprises a plurality of lenses each having birefringence and at least one element having form birefringence.

21. A device manufacturing method, comprising the steps of:

exposing a wafer with a device pattern by use of a projection exposure apparatus as recited in claim 20; and developing the exposed wafer.

22. An apparatus according to claim 20, wherein the amount of birefringence of said at least one optical element is substantially the same as the amount of birefringence of said plurality of lenses as a whole, and wherein the sign of birefringence of said at least one optical element is opposite to the sign of said plurality of lenses as a whole.

23. A projection exposure apparatus according to claim 20, wherein said at least one optical element produces the form birefringence by a grating having a period smaller than a wavelength used.

24. A projection exposure apparatus according to claim 18, wherein said at least one optical element comprises at least one element having a stress distribution.

25. A device manufacturing method, comprising the steps of:

exposing a wafer with a device pattern by use of a projection exposure apparatus as recited in claim 24; and developing the exposed wafer.

26. A projection exposure apparatus according to claim 18, wherein said at least one optical element comprises a transparent plane plate.

* * * * *

UNITED STATES PATENT AND TRADEMARK OFFICE
CERTIFICATE OF CORRECTION

PATENT NO. : 6,829,041 B2
DATED : December 7, 2004
INVENTOR(S) : Yasuyuki Unno

It is certified that error appears in the above-identified patent and that said Letters Patent is hereby corrected as shown below:

Column 5,
Line 30, "views;" should read -- views --.

Column 7,
Line 59, "a" should be deleted.

Column 9,
Line 22, "Pergam on" should ream -- Pergamon --.

Line 34, "$n_1 = 1/\sqrt{(t/n_1)^{2)+((1-t)/n_2^2]}}$" should read -- $n_1 = 1/\sqrt{(t/n_1^2)+[(1-t)/n_2^2]}$ --.

Column 11,
Line 56, "water" should read -- wafer --.

Column 13,
Line 24, "20C" should read -- 20C and --.
Line 30, "$\rho_r$" should read -- $\sigma_r$ --.
Line 46, "portion of" should be deleted.

Column 17,
Line 57, "abode," should read -- above, --.

Column 18,
Line 45, "a" should read -- on --.
Line 46, "of micron," should read -- of a micron --.

UNITED STATES PATENT AND TRADEMARK OFFICE
CERTIFICATE OF CORRECTION

PATENT NO. : 6,829,041 B2
DATED : December 7, 2004
INVENTOR(S) : Yasuyuki Unno

It is certified that error appears in the above-identified patent and that said Letters Patent is hereby corrected as shown below:

Column 21,
Line 47, "a" should read -- in a --.
Line 54, "the" should read -- a --.

Signed and Sealed this

Third Day of May, 2005

JON W. DUDAS
*Director of the United States Patent and Trademark Office*